(12) United States Patent  (10) Patent No.: US 7,910,444 B2
Servalli et al.  (45) Date of Patent: Mar. 22, 2011

(54) PROCESS FOR FORMING DIFFERENTIAL SPACES IN ELECTRONICS DEVICE INTEGRATED ON A SEMICONDUCTOR SUBSTRATE

(75) Inventors: Giorgio Servalli, Ciserano (IT); Giulio Albini, Giussano (IT); Carlo Cremonesi, Vaprio d'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/606,997

(22) Filed: Oct. 27, 2009

(65) Prior Publication Data

US 2010/0047980 A1 Feb. 25, 2010

Related U.S. Application Data

(62) Division of application No. 11/680,507, filed on Feb. 28, 2007, now abandoned.

(51) Int. Cl.
*H01L 21/8234* (2006.01)
(52) U.S. Cl. ........... 438/275; 257/E21.626; 257/E21.64; 257/500; 257/501; 257/391; 257/392
(58) Field of Classification Search ........... 257/E21.626, 257/E21.64, 500–502, 391, 392; 438/275
See application file for complete search history.

(56) References Cited

U.S. PATENT DOCUMENTS

| | | | |
|---|---|---|---|
| 5,445,984 A * | 8/1995 | Hong et al. | 438/261 |
| 6,506,642 B1 | 1/2003 | Luning et al. | |
| 6,635,538 B2 * | 10/2003 | Morihara et al. | 438/299 |
| 6,943,077 B2 | 9/2005 | Liu et al. | |
| 2004/0232511 A1 | 11/2004 | Fujio et al. | |
| 2005/0179078 A1 * | 8/2005 | Lee | 257/314 |
| 2005/0202622 A1 | 9/2005 | Violette et al. | |
| 2005/0269640 A1 * | 12/2005 | Shimamoto et al. | 257/351 |

* cited by examiner

*Primary Examiner* — N Drew Richards
*Assistant Examiner* — Yu-Hsi Sun
(74) *Attorney, Agent, or Firm* — Lisa K. Jorgenson; Robert Iannucci; Seed IP Law Group PLLC

(57) ABSTRACT

A forms spacers in a electronic device integrated on a semiconductor substrate that includes: first and second transistors each comprising a gate electrode projecting from the substrate and respective source/drain regions. The process comprises: forming in cascade a first protective layer and a first conformal insulating layer of a first thickness on the whole electronic device; forming a first mask to cover the first transistor; removing the first conformal insulating layer not covered by the first mask; removing the first mask; forming a second conformal insulating layer of a second thickness on the whole device; and removing the insulating layers until the protective layer is exposed to form first spacers of a first width on the side walls of the gate electrodes of the first transistor and second spacers of a second width on the side walls of the gate electrodes of the second transistor.

21 Claims, 18 Drawing Sheets

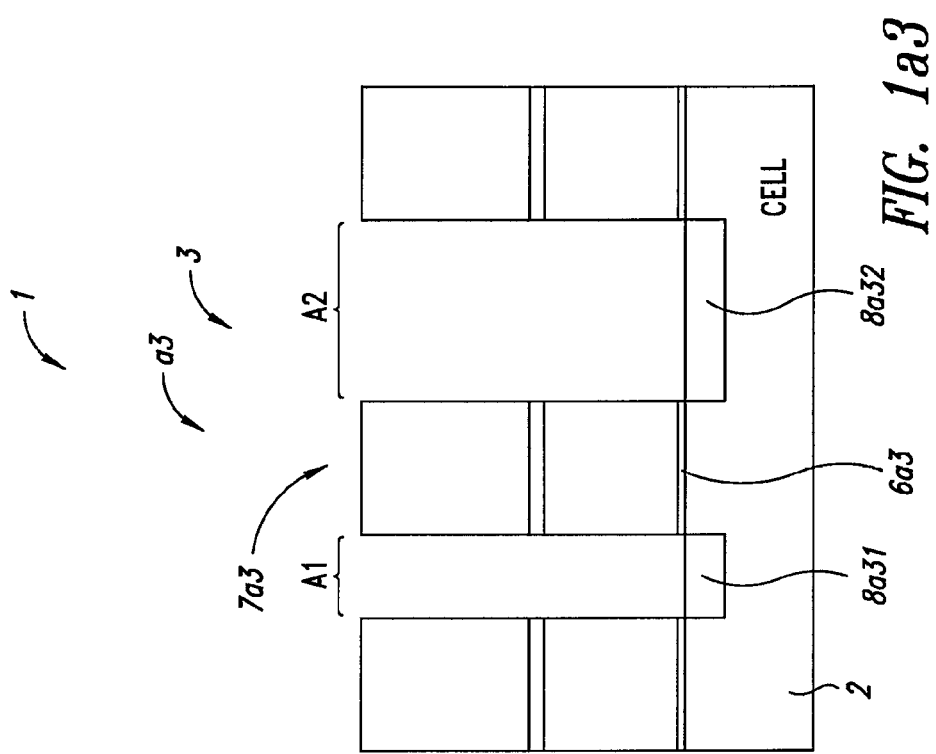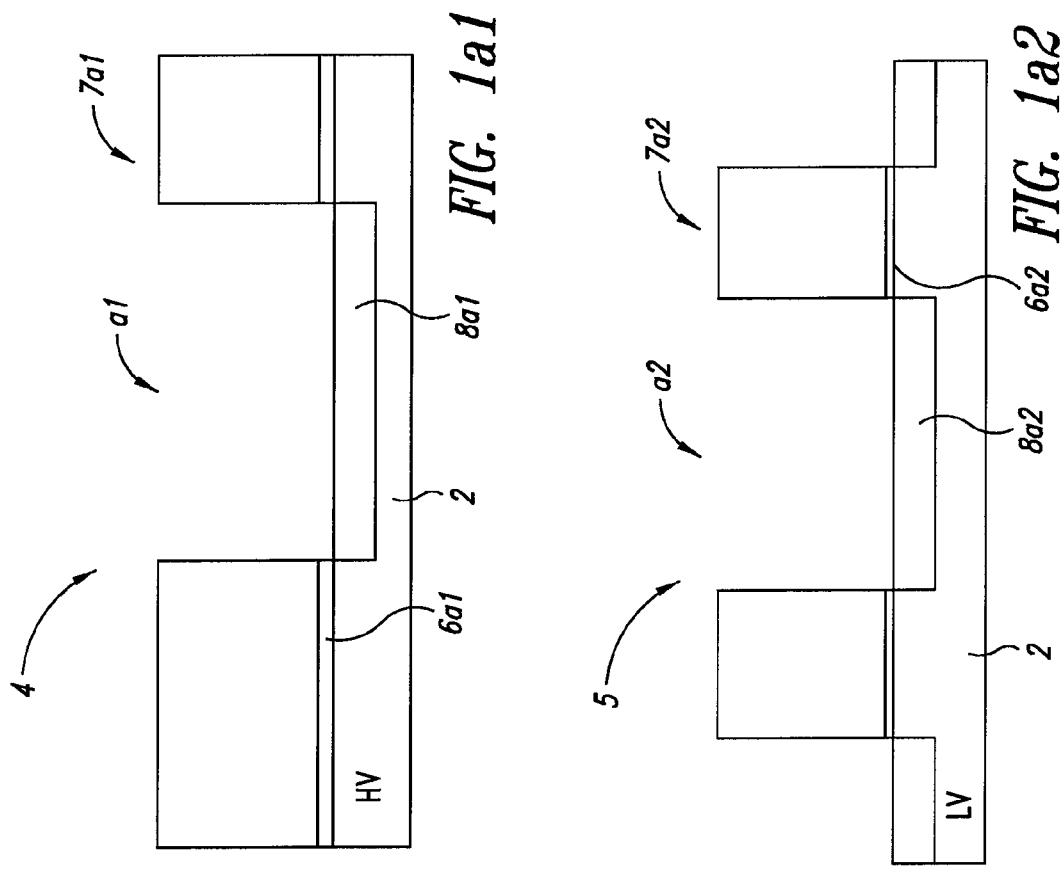

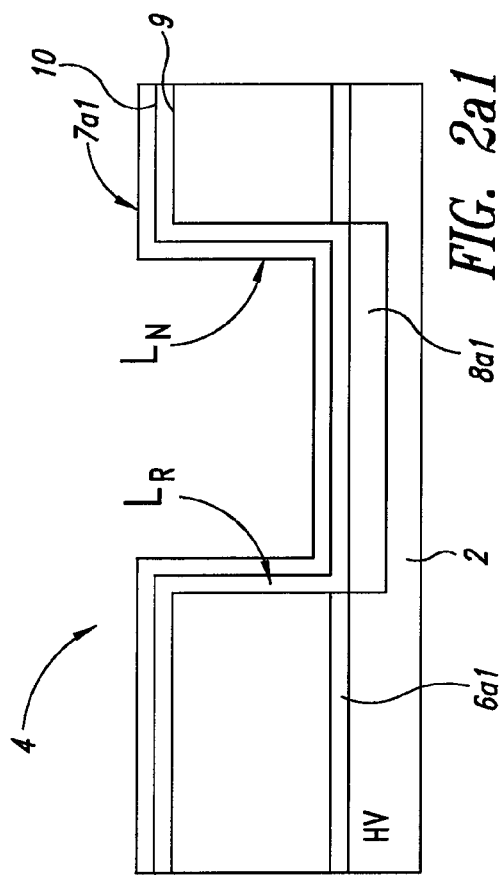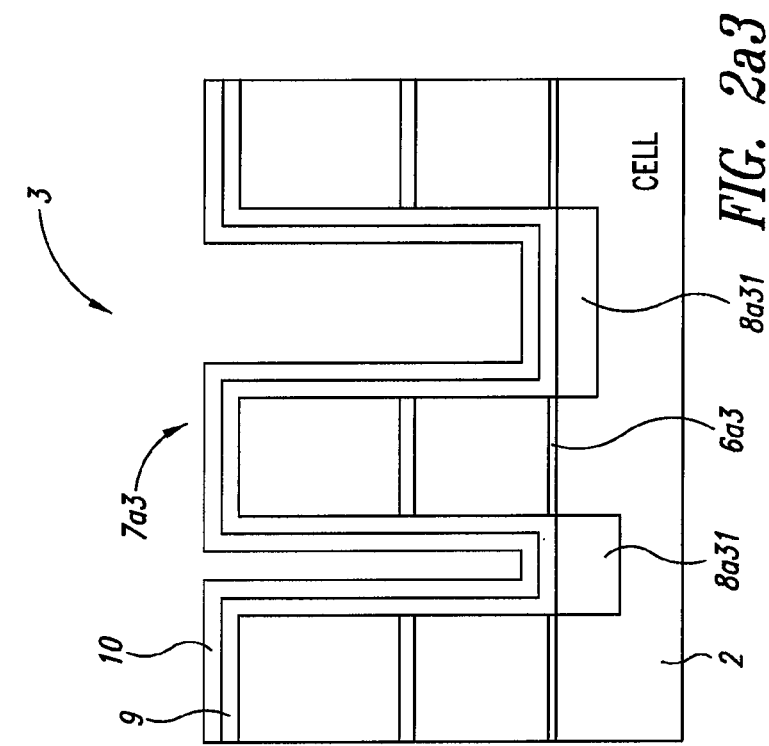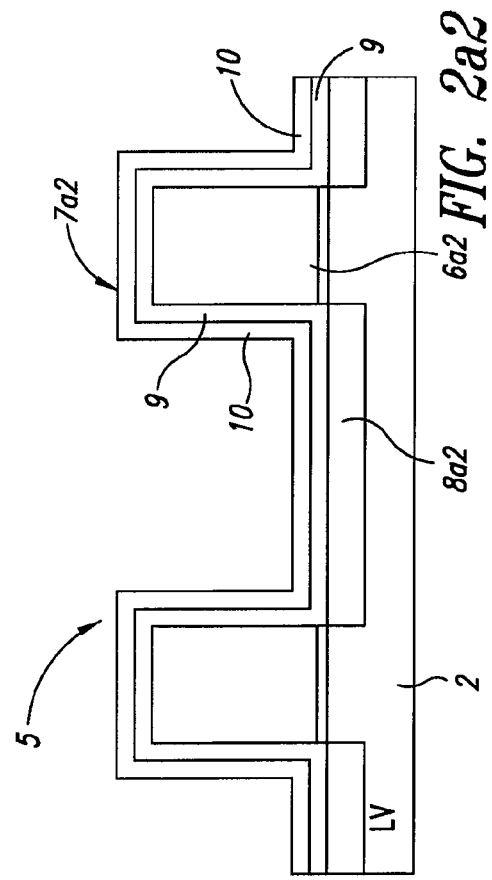

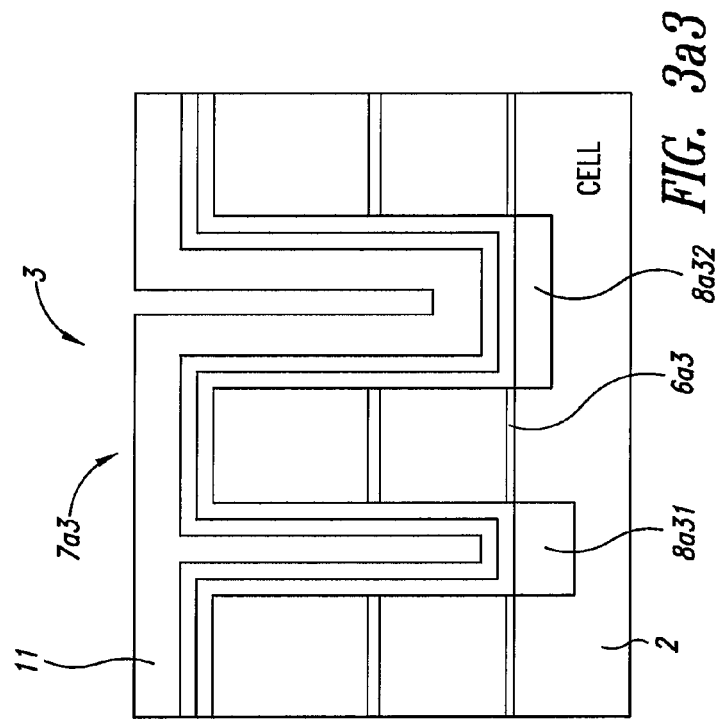
FIG. 3a3
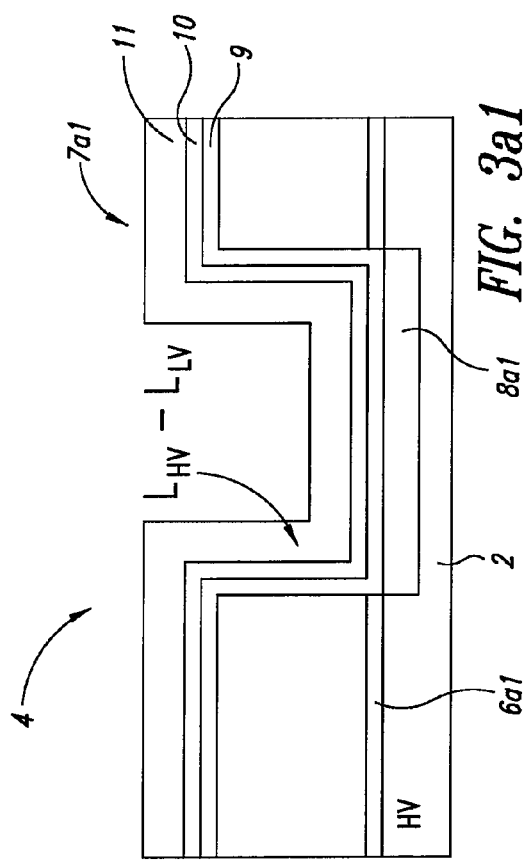
FIG. 3a1
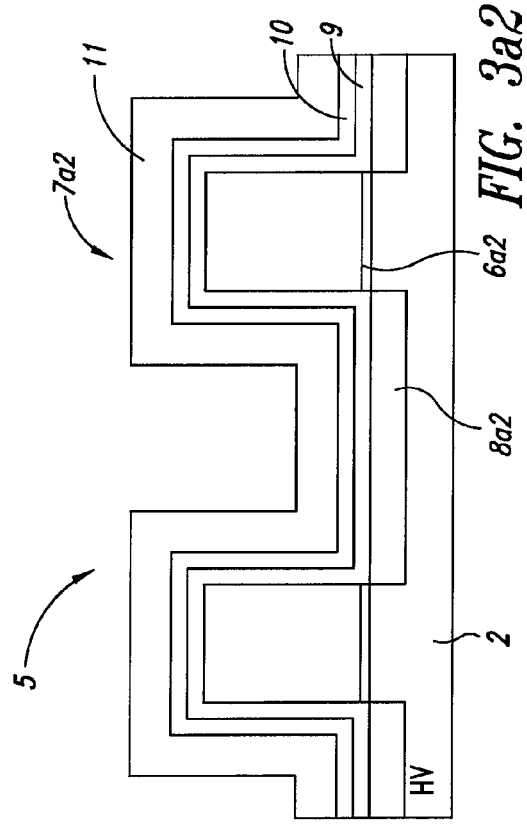
FIG. 3a2

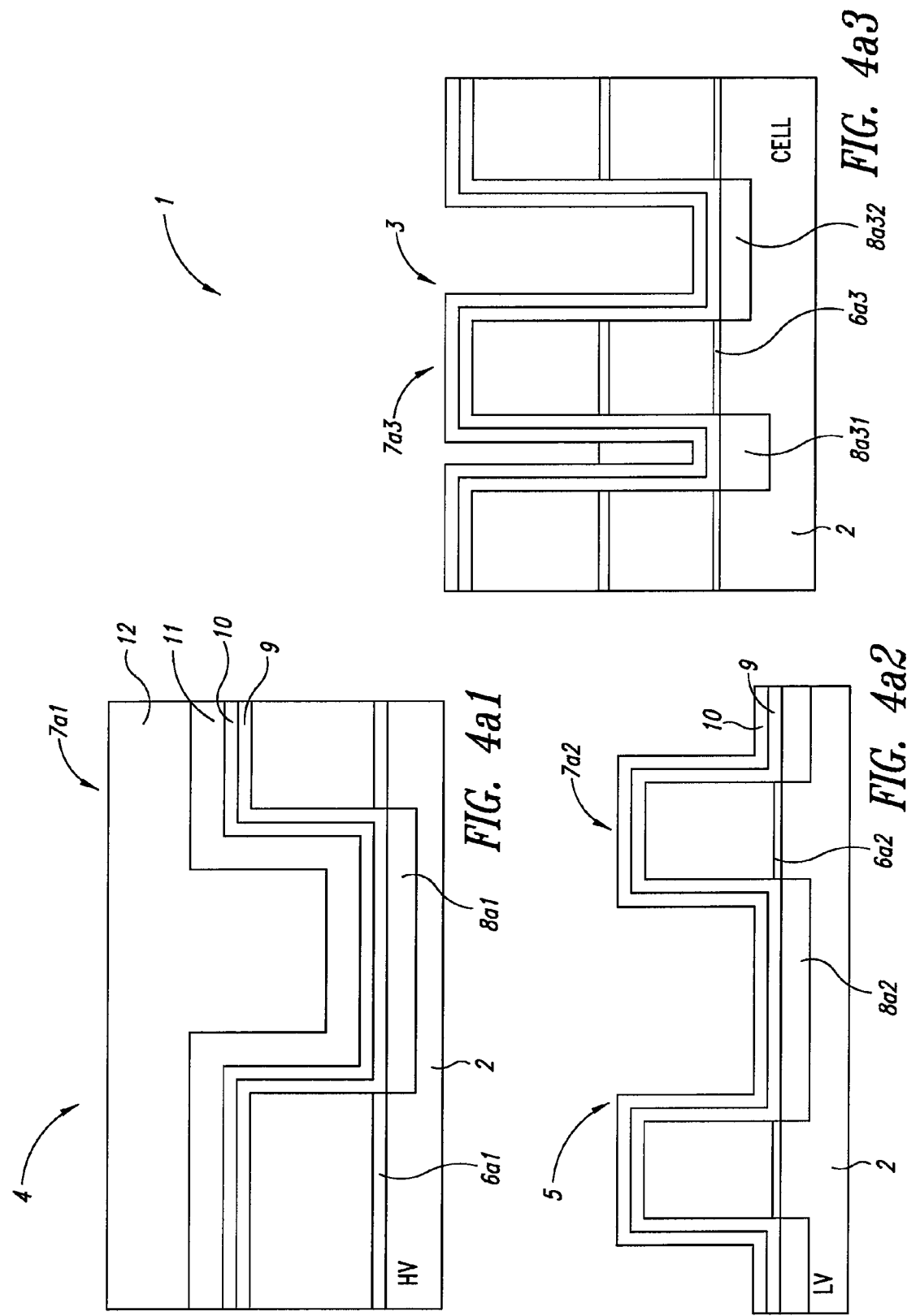

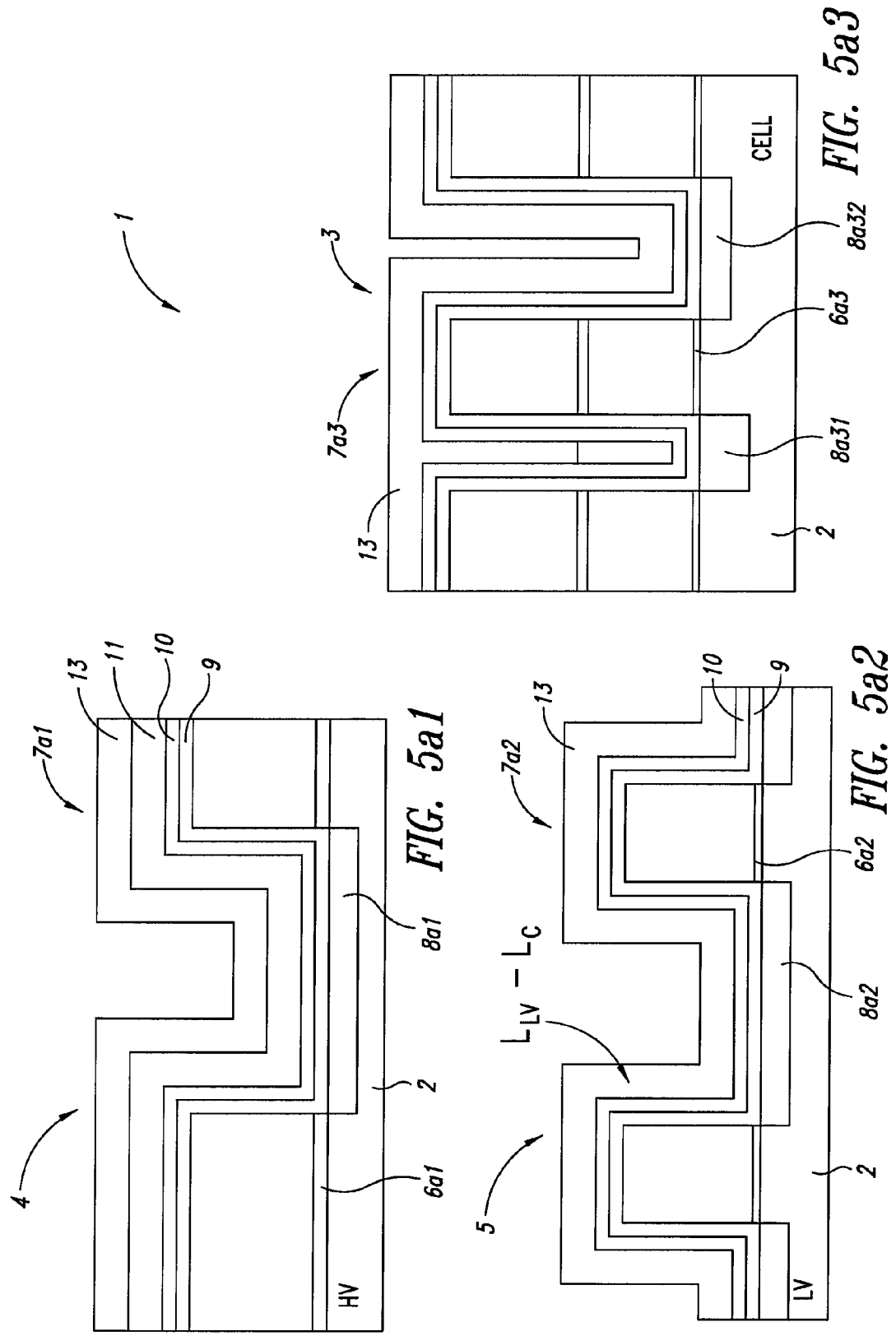

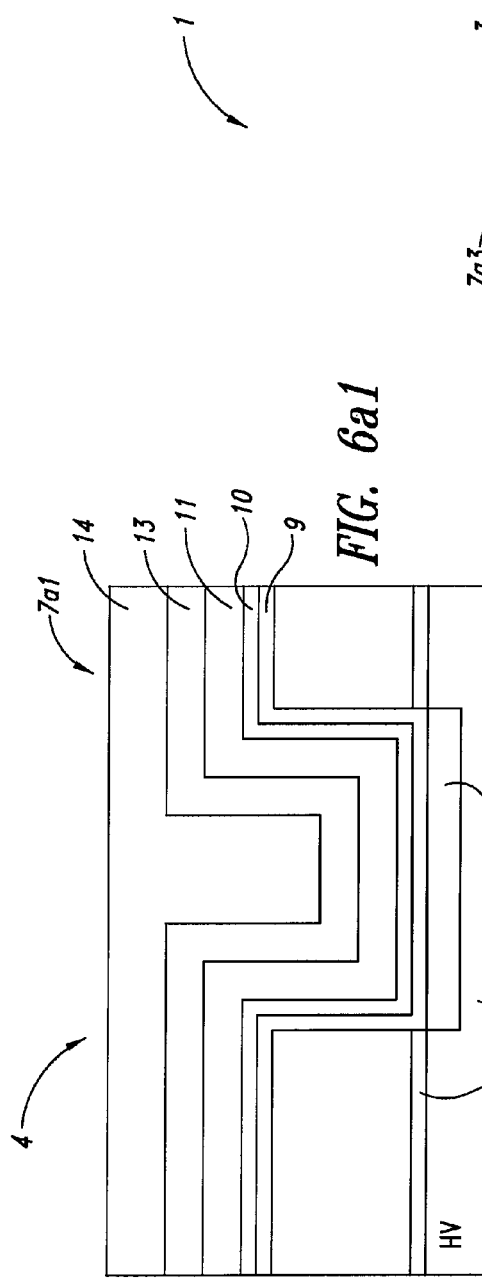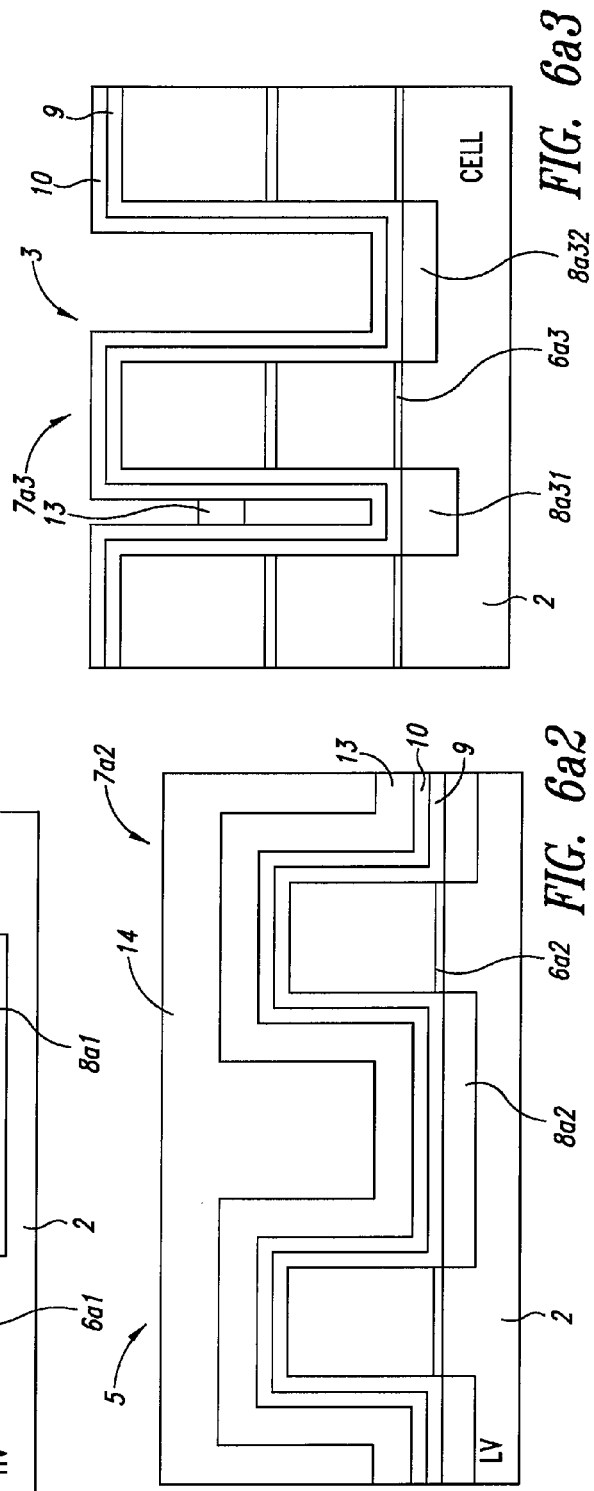
FIG. 6a1
FIG. 6a2
FIG. 6a3

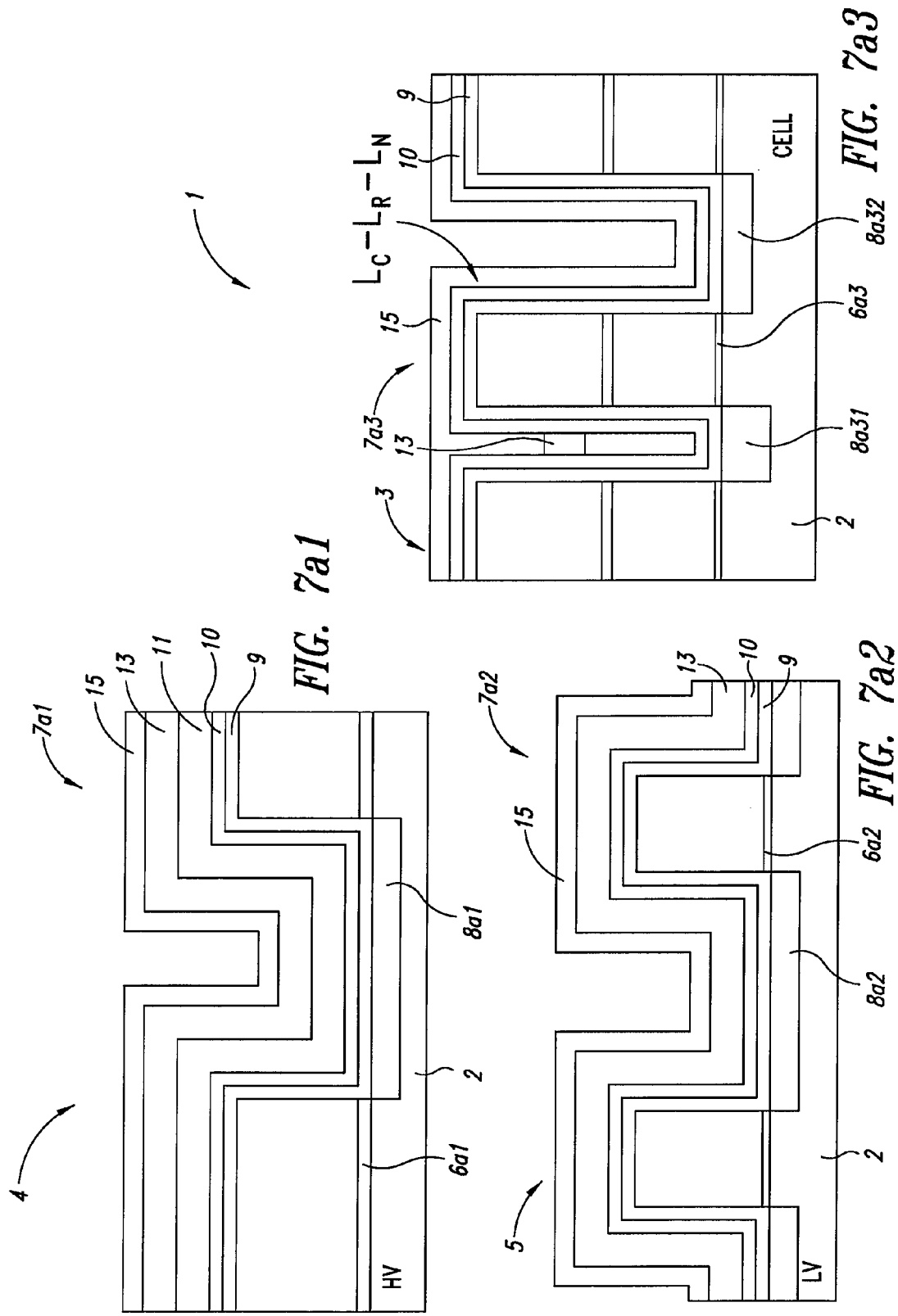

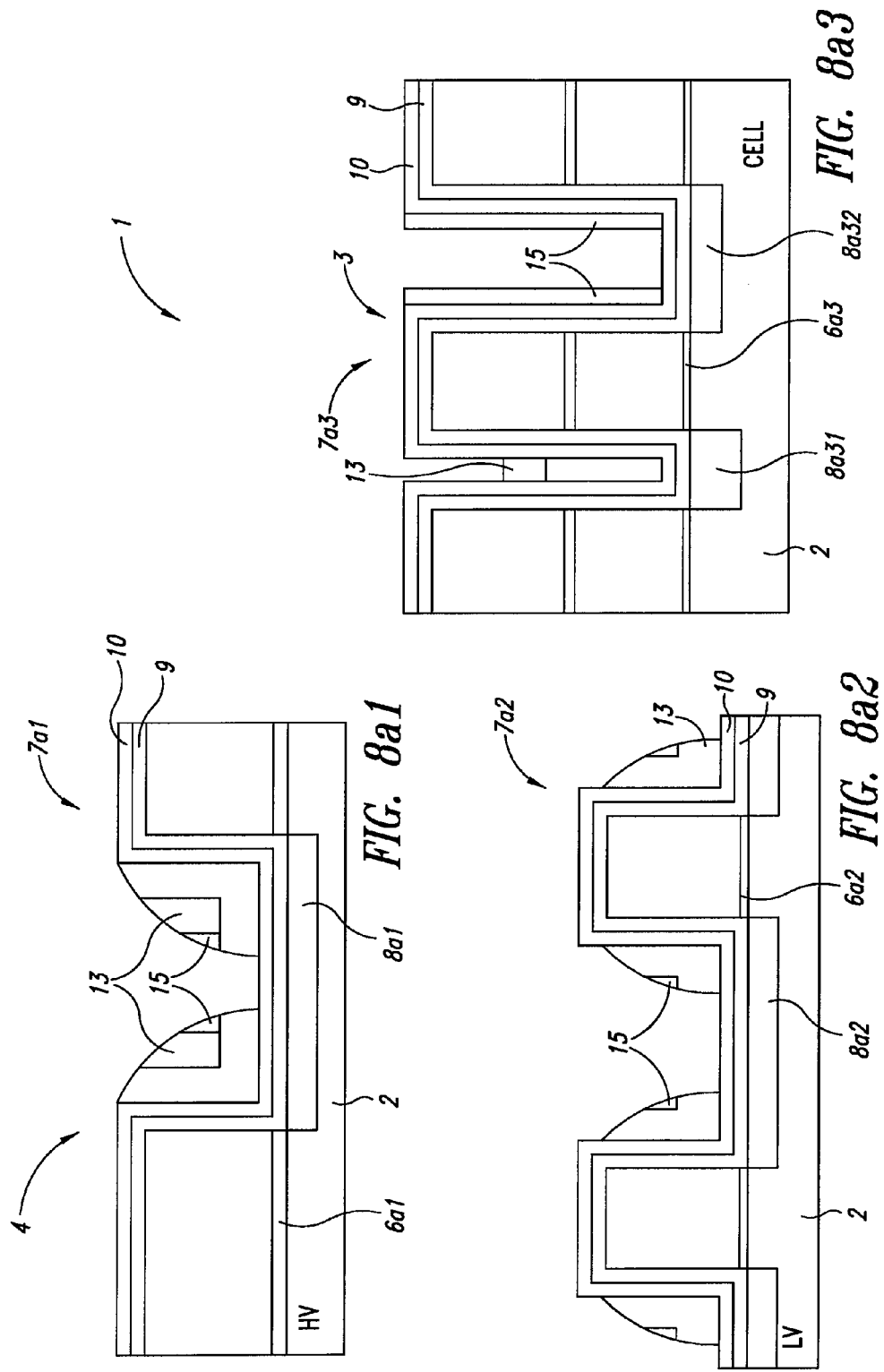

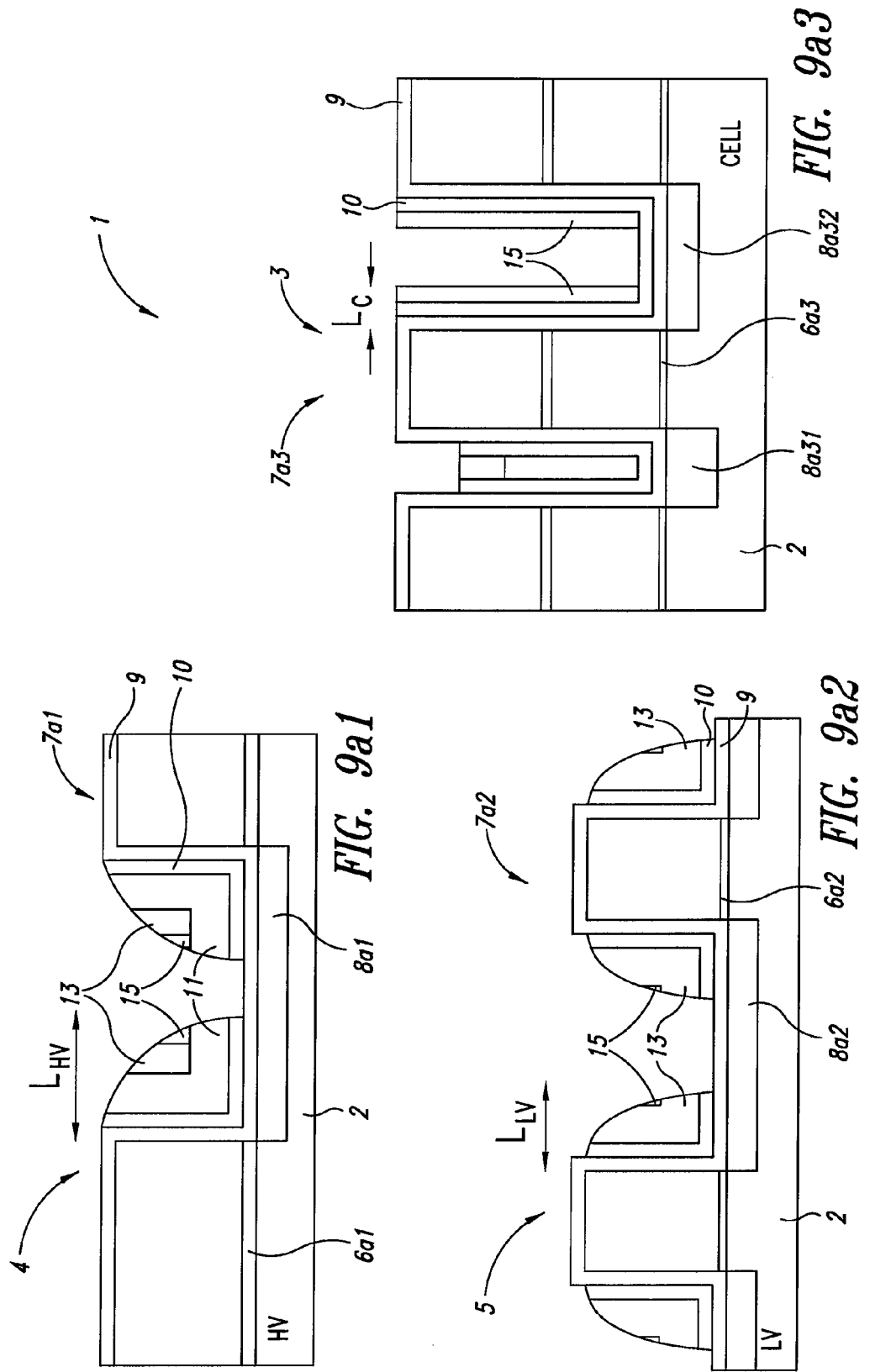

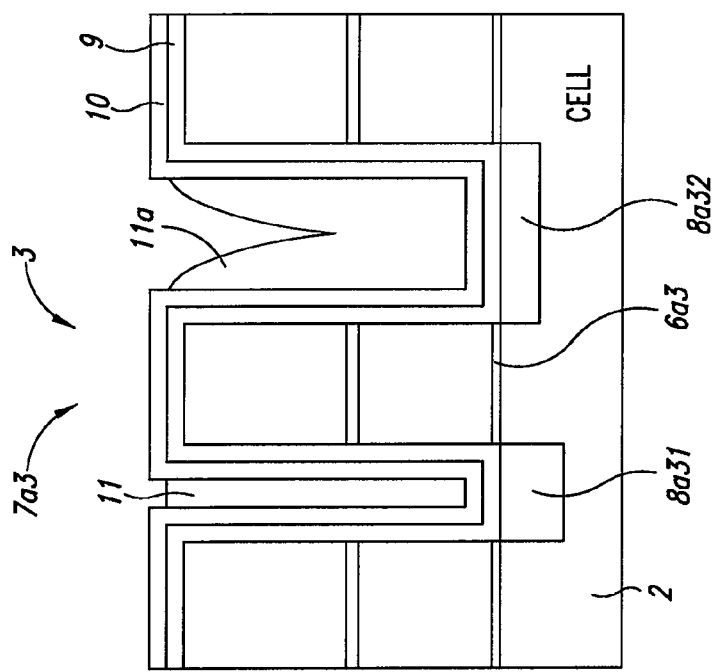
FIG. 10a3
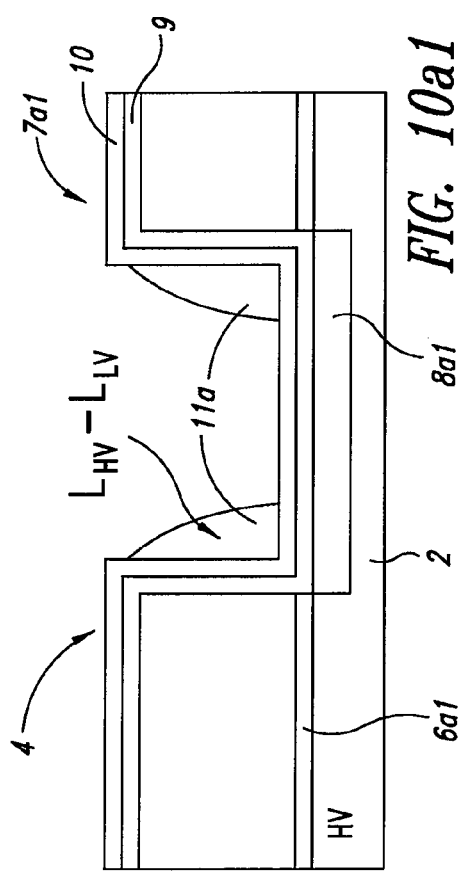
FIG. 10a1
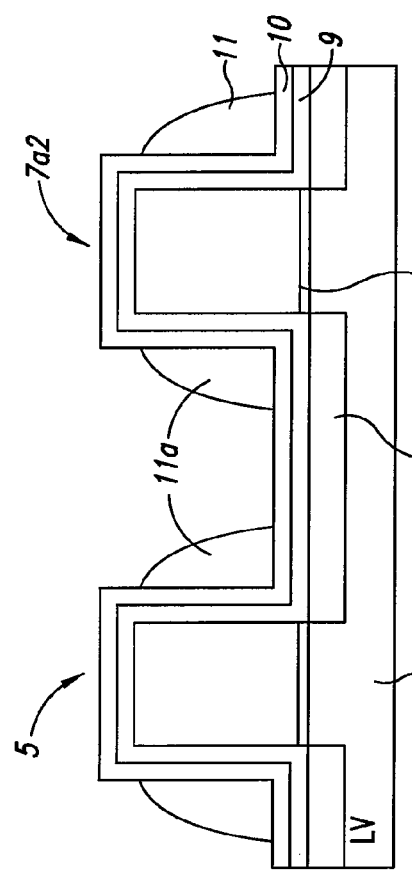
FIG. 10a2

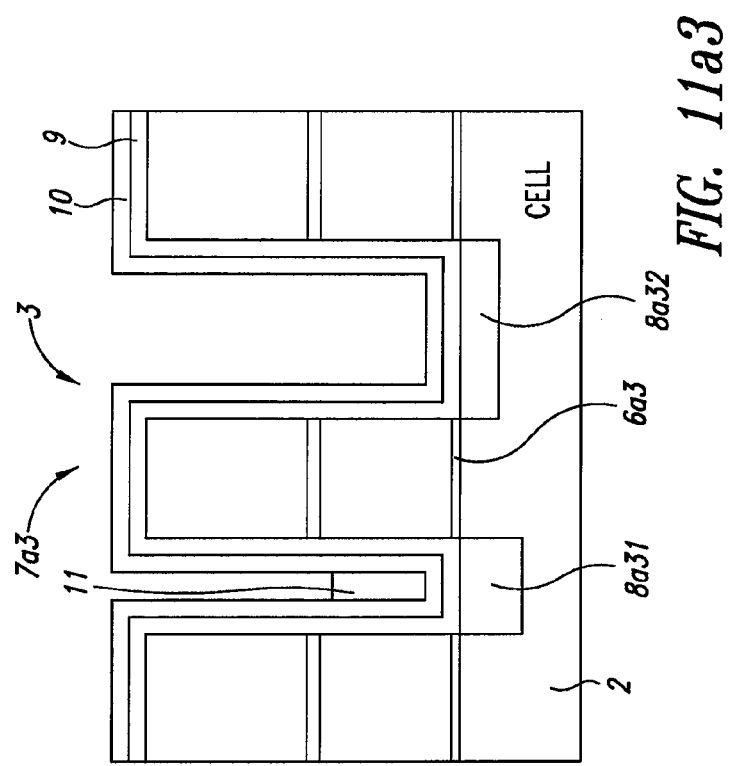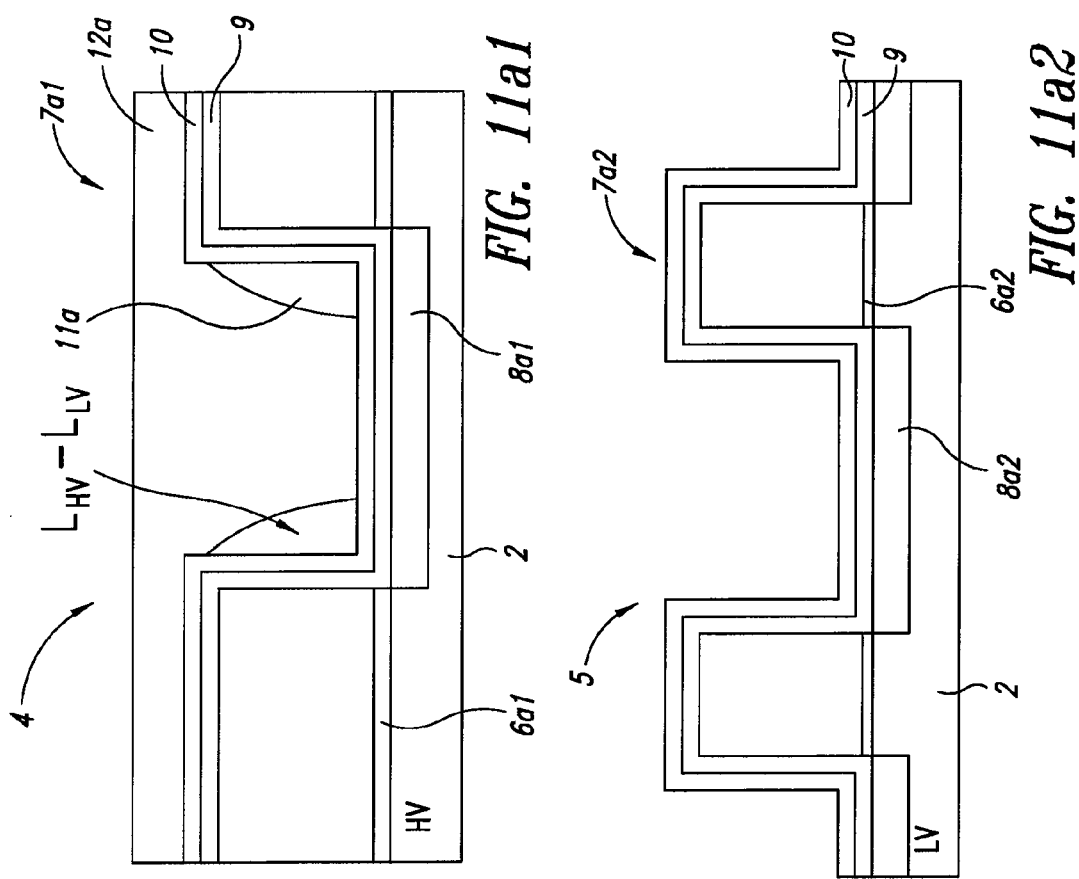

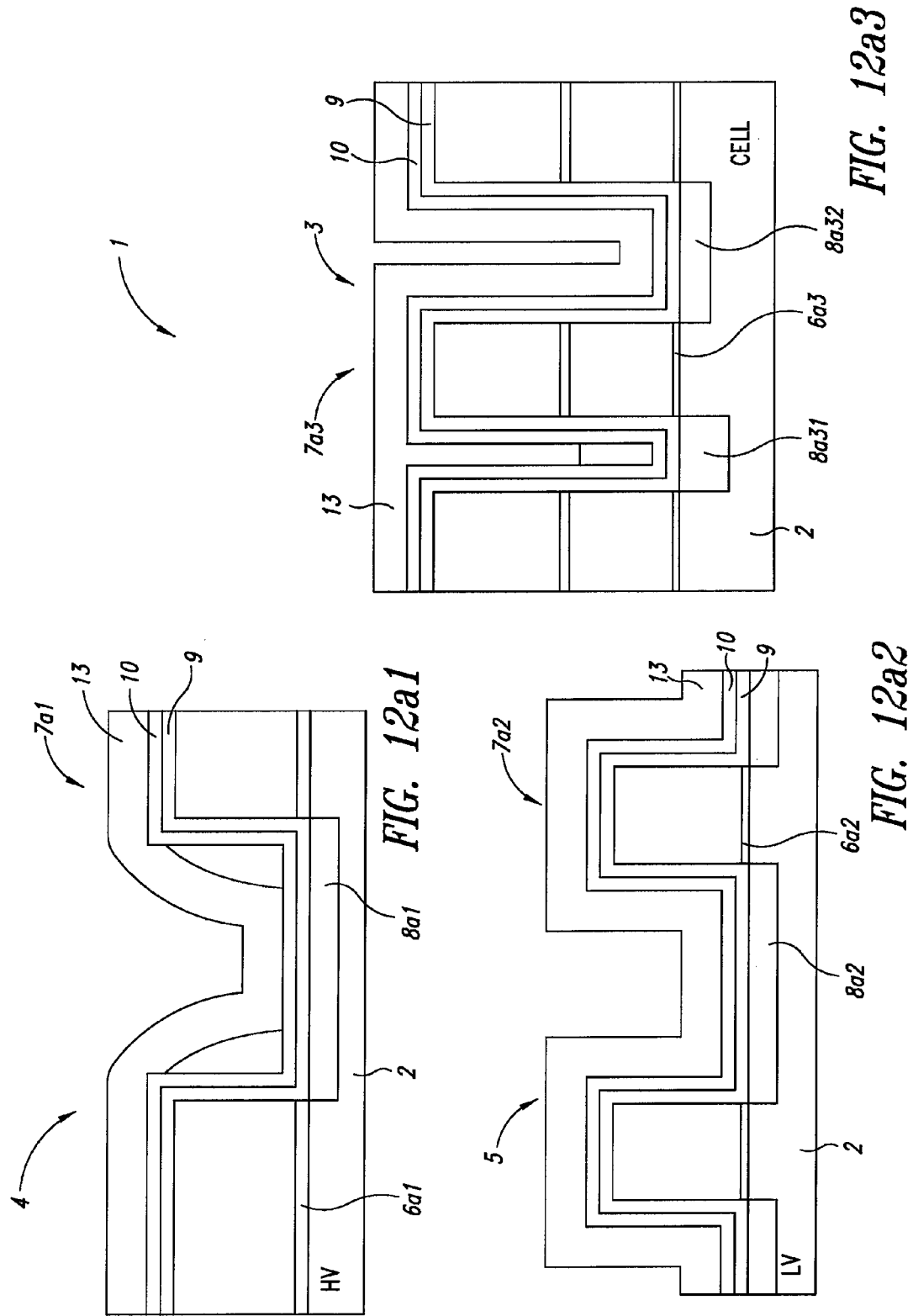

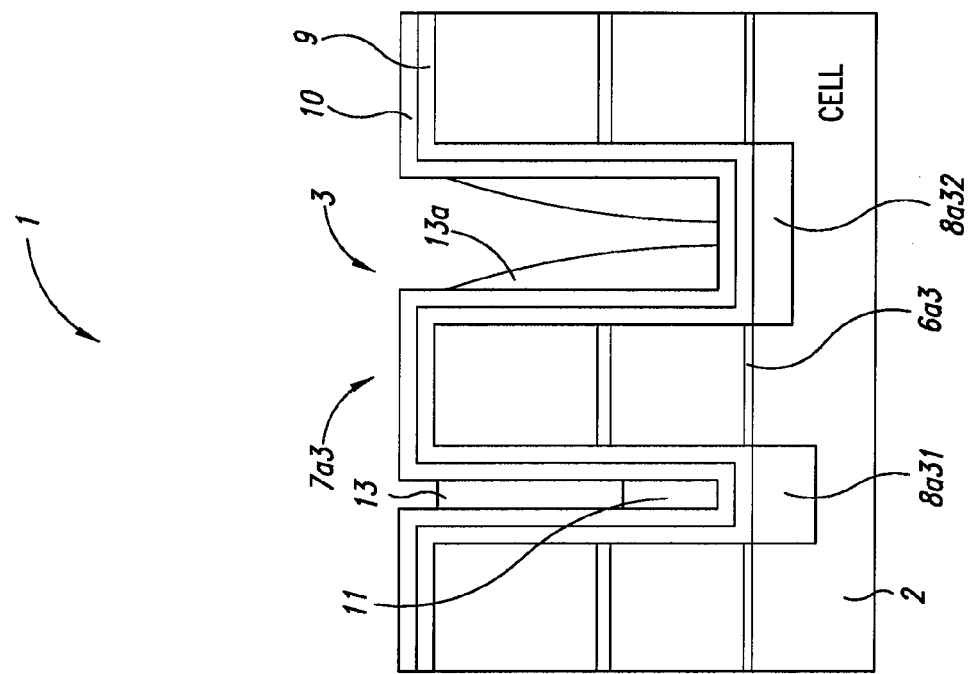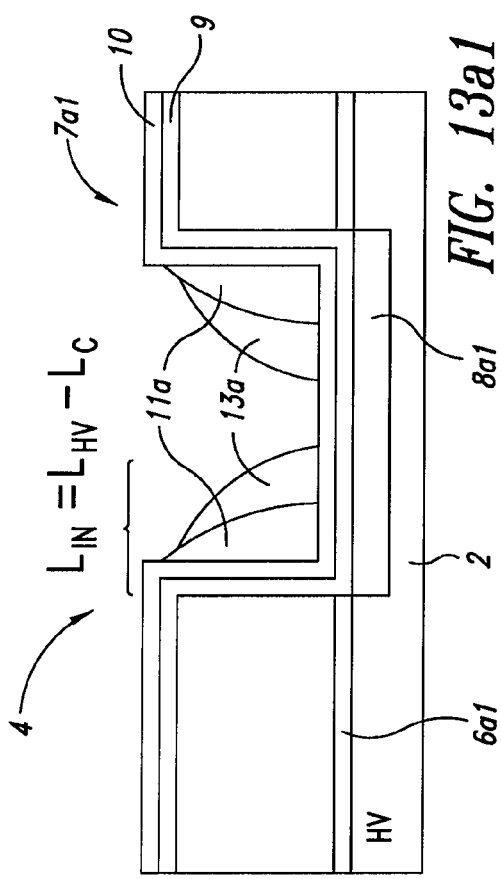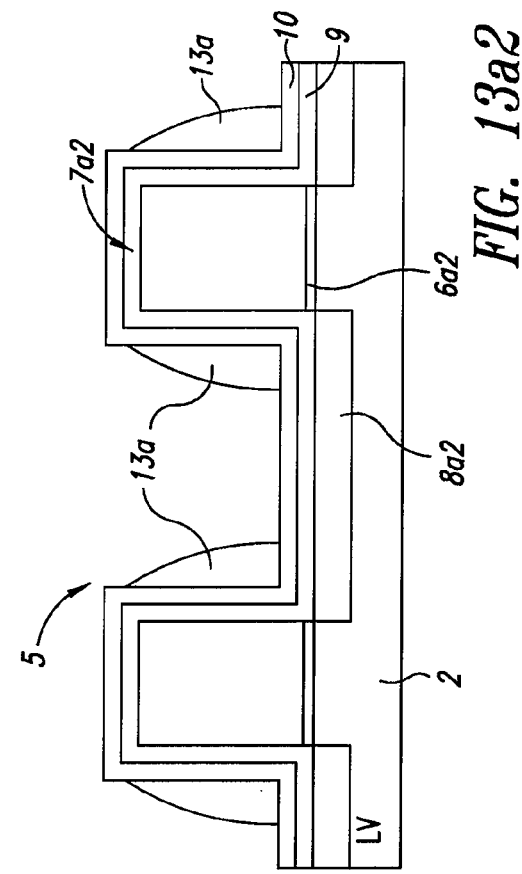
FIG. 13a1    FIG. 13a2    FIG. 13a3

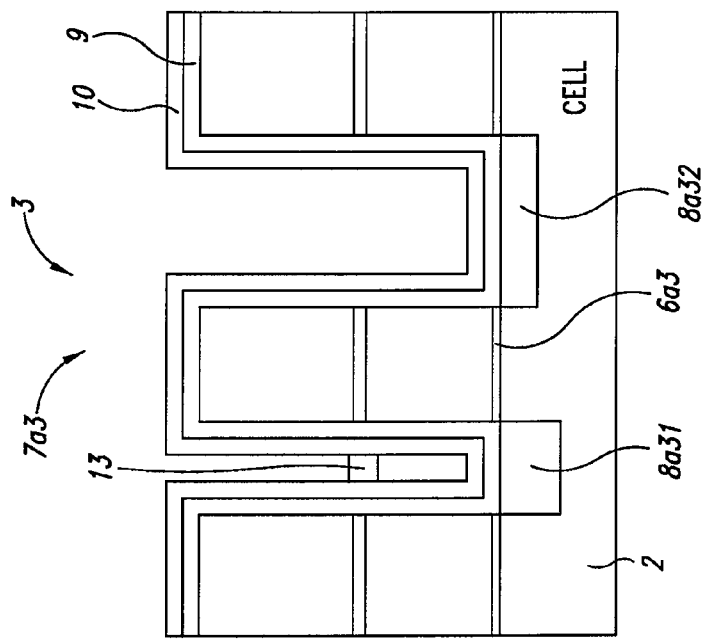
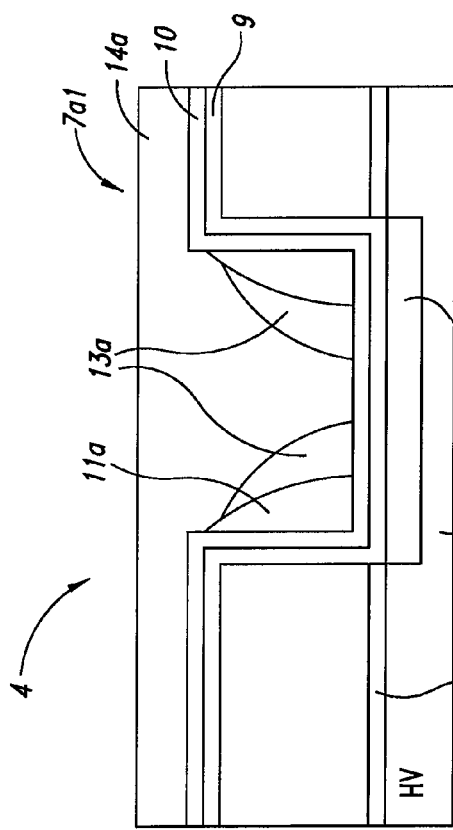
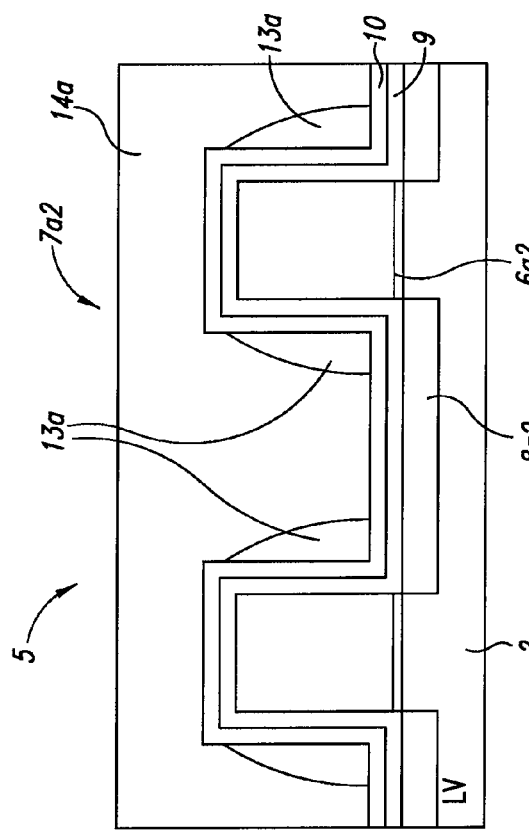
FIG. 14a1
FIG. 14a2
FIG. 14a3

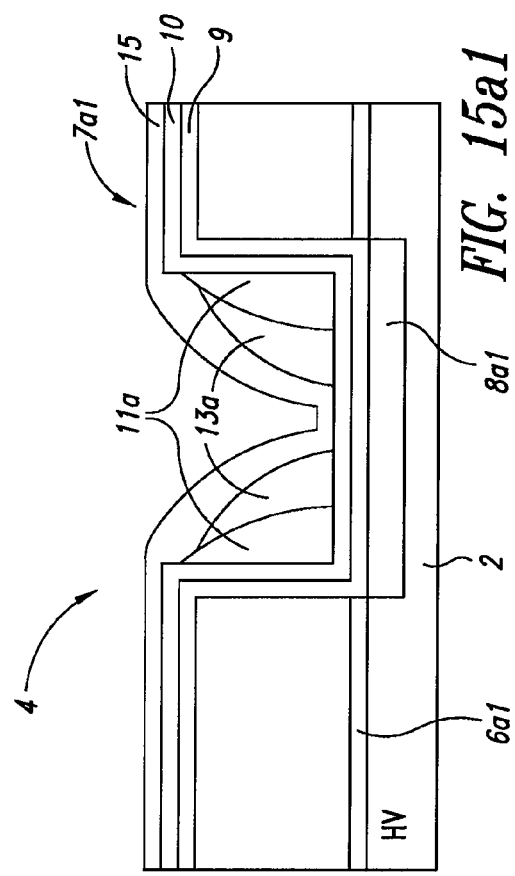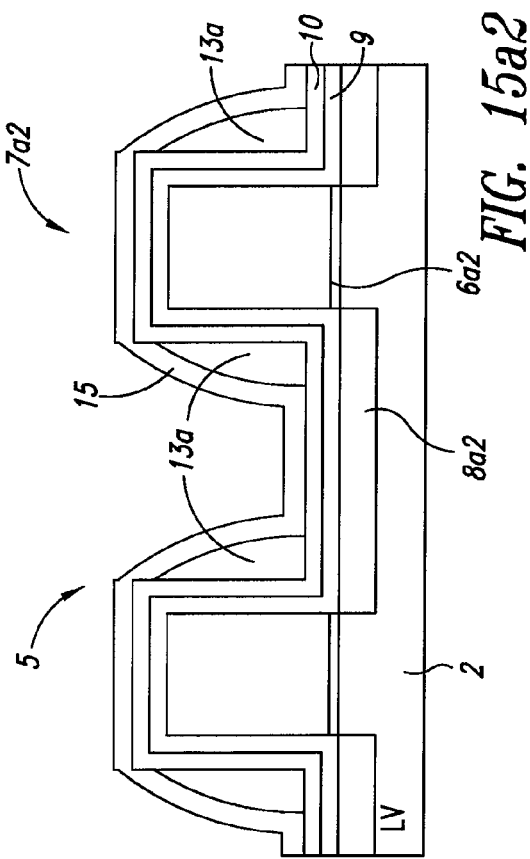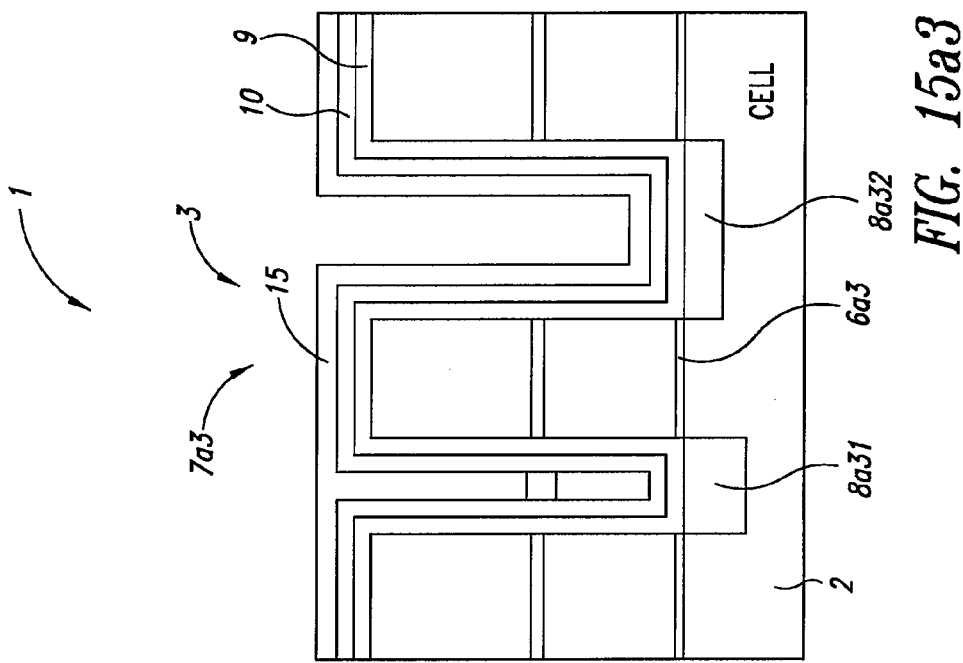

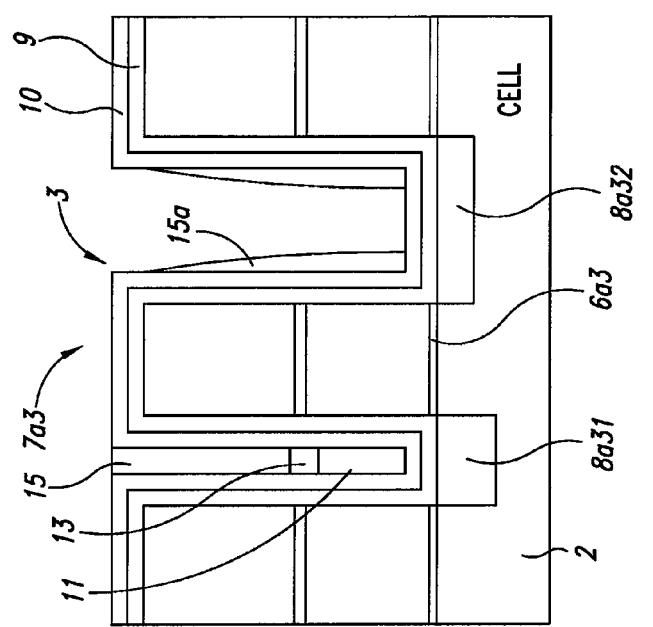
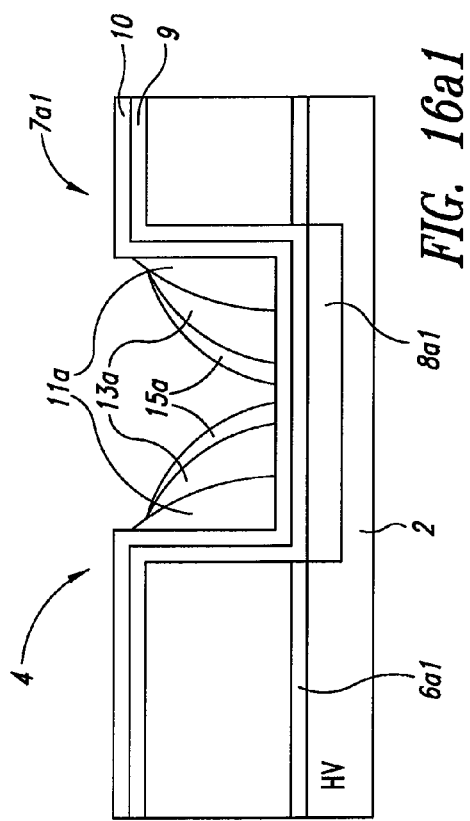
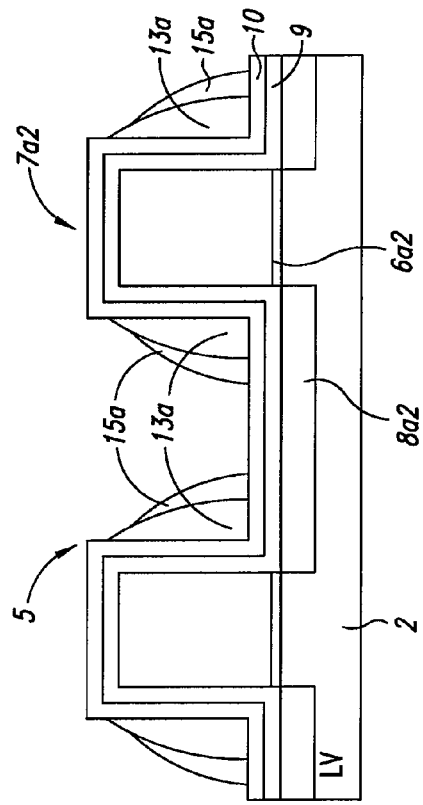

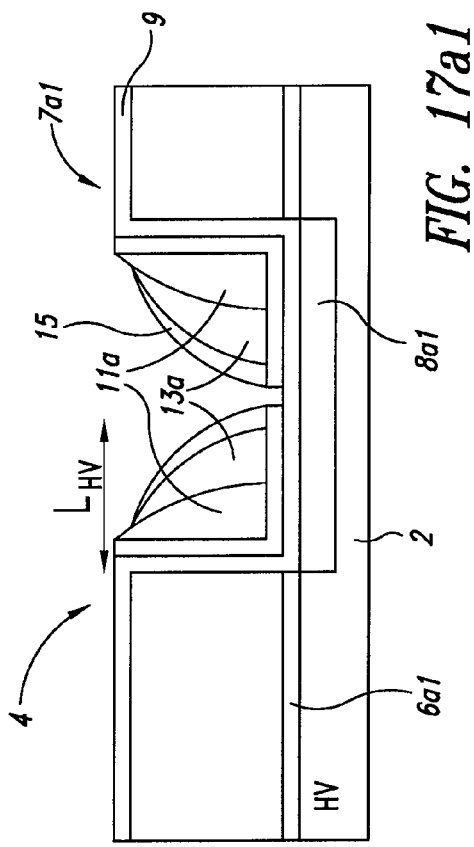
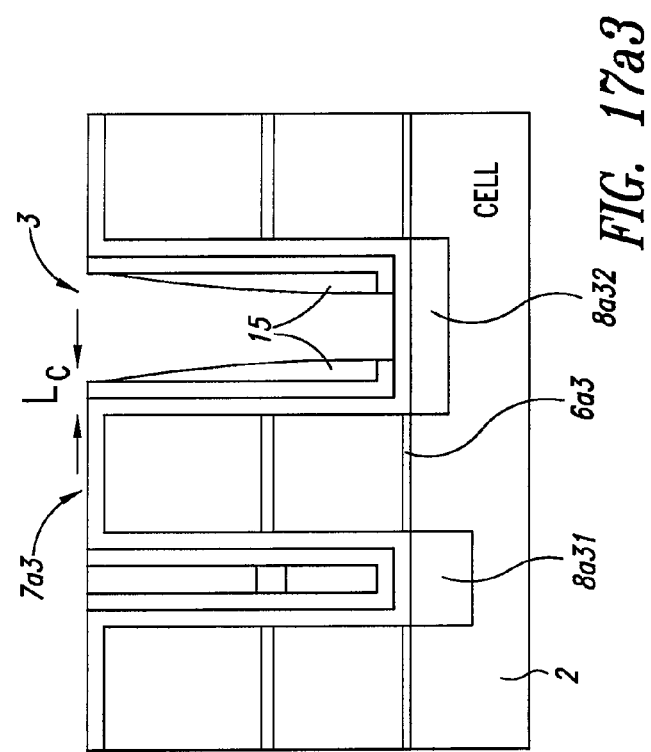
FIG. 17a1
FIG. 17a2
FIG. 17a3

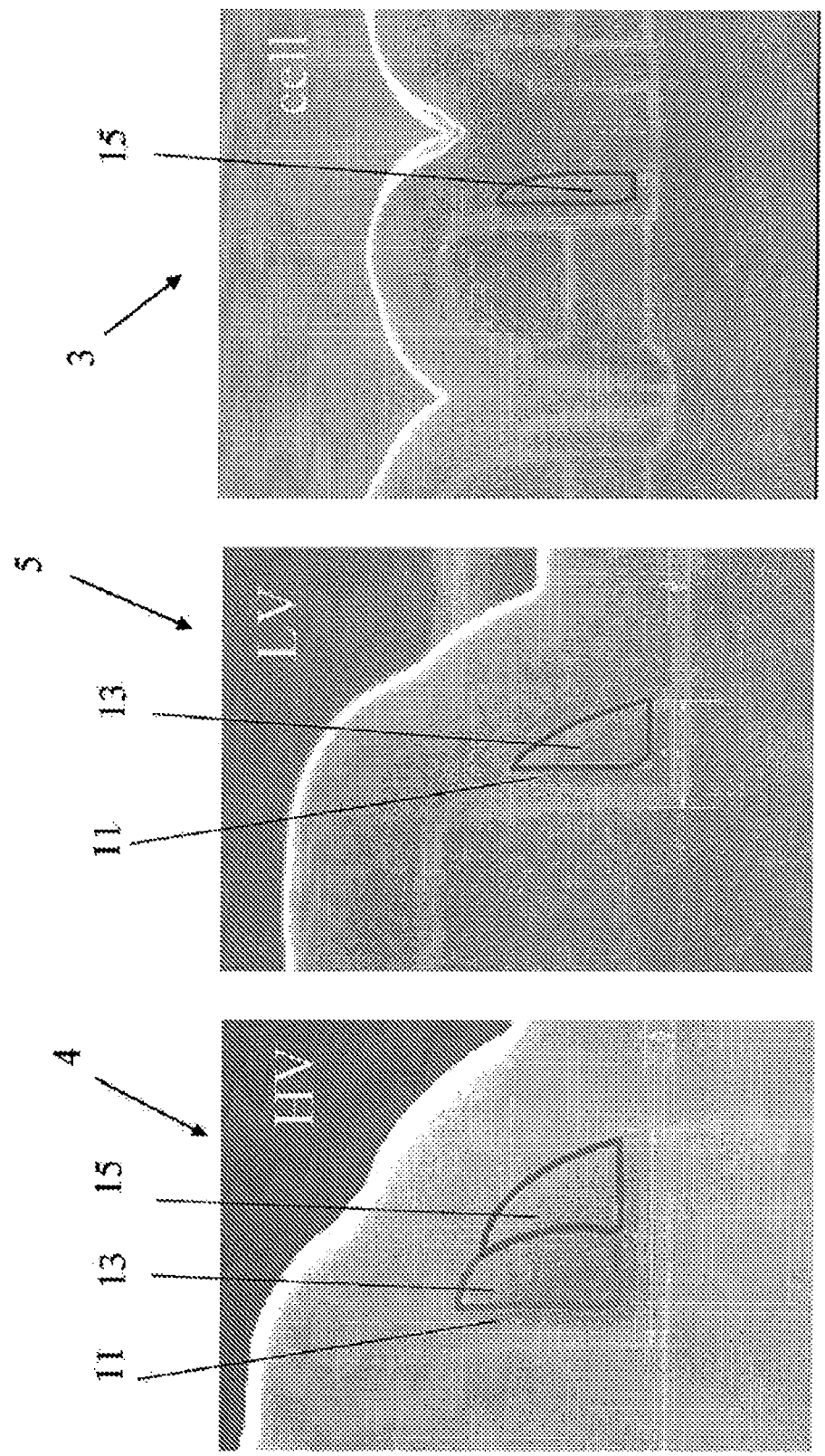
FIG. 18a3
FIG. 18a2
FIG. 18a1

US 7,910,444 B2

PROCESS FOR FORMING DIFFERENTIAL SPACES IN ELECTRONICS DEVICE INTEGRATED ON A SEMICONDUCTOR SUBSTRATE

BACKGROUND OF THE INVENTION

1. Field of the Invention

The present invention relates to a process for forming of differential spacers in electronic devices integrated on a semiconductor substrate.

The invention particularly, but not exclusively, relates to a process for forming differential spacers in floating gate non-volatile memory devices and the following description is made with reference to this field of application by way of illustration only.

2. Description of the Related Art

As it is well known, non-volatile memory electronic devices, for example of the Flash type, integrated on semiconductor substrate comprise a matrix of non-volatile memory cells organized in rows, called word lines, and columns, called bit lines.

Each single non-volatile memory cell comprises a MOS transistor wherein the gate electrode, arranged above the channel region, is floating, i.e., it shows high impedance in DC towards all the other terminals of the same cell and of the circuit wherein the cell is inserted.

The cell also comprises a second electrode, called the control gate, which is capacitively coupled to the floating gate electrode through an intermediate dielectric layer, so called interpoly. This second electrode is driven through suitable control voltages. The other electrodes of the transistor are the usual drain, source terminals.

The cells belonging to a same word line share the electric line which drives the respective control gates, while the cells belonging to a same bit line share the drain terminals.

Conventionally, memory electronic devices also comprise control circuitry associated with the matrix of memory cells. The control circuitry comprises conventional high voltage (HV) MOS transistors, each one having a source region and a drain region separated by a channel region. A gate electrode is then formed on the channel region and insulated therefrom by a gate oxide layer.

Moreover, spacers are present on the side walls of the gate electrodes.

However, in new generation memory devices the circuitry also comprises low voltage (LV) transistors with high performances in particular for embedded applications and for carrying out, at high speed, the complex management algorithms of the memory devices themselves. The process steps for forming these advanced technology LV transistors, especially those pertaining to the formation of the junction implants (source and drain regions) and of the spacers are particularly complex. In particular, the integration of the high performance LV transistors with the HV transistors handling the high voltages for writing to the memory cells is further complex, with the need of introducing differential spacers and junction implants.

The known process solutions currently in use provide that the circuitry spacers are formed also in the memory matrix, possibly with differential processes, and that the circuitry spacers are formed by nitride films and rather thick oxide layers.

Although advantageous under several aspects, this solution shows several drawbacks.

In fact, these process steps are not necessary for the formation of non-volatile memory cells, for example, with NOR or NAND architecture, whose source and drain regions are usually defined in a self-aligned way to the gate electrodes and for which the spacers are non-necessary elements which can become a heavy limitation for the scalability of the cell, in particular for the salicidation of the drain regions, for filling with premetal dielectric layers, for the integration of the drain contact and for the sustainability of the reading disturbances.

BRIEF SUMMARY OF THE INVENTION

One embodiment of the invention is a process for forming, in a same electronic device integrated on a semiconductor substrate, electronic components with spacers of different widths, having such structural and functional characteristics as to minimize the overall dielectric constant of the dielectric layers which separate some electronic components of the device, thereby overcoming the limits and/or drawbacks still limiting the devices formed according to the prior art.

An embodiment of this invention is directed to a process for forming, by more insulating layers, spacers of greater width.

According to an embodiment of the invention, a process forms spacers in an electronic device integrated on a semiconductor substrate that includes:

a first portion wherein first transistors are formed each comprising a gate electrode projecting from the semiconductor substrate and at least first portions of respective source/drain regions, a second portion wherein second transistors are formed each comprising a gate electrode projecting from the semiconductor substrate and at least first portions of respective source/drain regions, the process comprising the step of:

forming in cascade a first protective layer of a first thickness and a first conformal insulating layer of a first thickness on the whole electronic device, forming a first mask to cover the first portion, removing the first conformal insulating layer not covered by the first mask, removing the first mask, forming a second conformal insulating layer of a second thickness on the whole device, removing the insulating layers until the protective layer is exposed to form first spacers of a first width on the side walls of the gate electrodes of the first portion and second spacers of a second width on the side walls of the gate electrodes of the second portion.

According to another embodiment of the invention, a process for forming spacers in a electronic device integrated on a semiconductor substrate comprises at least:

a first portion wherein first transistors each comprising a gate electrode projecting from the semiconductor substrate and at least first portions of respective source/drain regions (8a1) are formed, a second portion wherein second transistors (3) each comprising a gate electrode projecting from the semiconductor substrate and at least first portions of respective source/drain regions are formed, the process comprising the step of:

forming in cascade a first protective layer of a first thickness and a first conformal insulating layer of a first thickness on the whole electronic device, removing the first conformal insulating layer until the protective layer is exposed to form first spacers on the side walls of the gate electrodes, forming a first mask to cover the first portion, removing the first spacers not covered by the first mask, removing the first mask, forming a second conformal insulating layer of a second thickness on the whole device, removing the third conformal insulating layer until the protective layer is exposed to form second spacers adjacent to the first spacers and on the side walls of the gate electrodes of the second portion.

Yet another embodiment of the invention is directed to a process for forming spacers in a electronic device integrated on a semiconductor substrate which comprises a plurality of portions wherein respective transistors, each comprising a gate electrode projecting from the semiconductor substrate, and at least first portions of respective source/drain regions are formed, the process comprising the steps of:

a) forming in cascade a protective layer and an insulating layer on the whole electronic device,
b) forming a mask for covering a portion of the device,
c) removing the conformal insulating layer not covered by the mask,
d) removing the mask,
e) forming another conformal insulating layer on the whole electronic device,
f) forming another mask to cover the preceding portion and another portion of the device,
g) removing the other conformal insulating layer not covered by the other mask,
h) removing the other mask,
i) repeating the steps e) to h) until a sole portion of the device, wherein the spacers are to be formed, is coated by a conformal insulating layer,
l) forming a final conformal insulating layer of a final thickness on the whole device,
m) removing the insulating layers until the protective layer is exposed to form a plurality of spacers on respective side walls of the gate electrodes of the plurality of portions of the device.

A further embodiment relates to a process for forming spacers in a electronic device integrated on a semiconductor substrate which comprises a plurality of portions wherein respective transistors are formed each comprising a gate electrode projecting from the semiconductor substrate and at least first portions of respective source/drain regions, the process comprising the steps of:

a) forming in cascade a protective layer and a conformal insulating layer on the whole electronic device,
b) removing the conformal insulating layer until the protective layer is exposed for forming spacers on the side walls of the gate electrodes,
c) forming a mask to cover a portion of the device,
d) removing the uncovered spacers from the mask,
e) removing the mask,
f) forming another conformal insulating layer on the whole electronic device,
g) removing another conformal insulating layer until the protective layer is exposed to form other spacers on the preceding spacers (11a) and on the side walls of the gate electrodes of the remaining portions,
h) forming another mask to cover the preceding portion and another portion,
i) removing the other spacers not covered by the other mask,
l) removing the other mask,
m) repeating the steps f) to l) until a sole portion of the device, wherein the spacers are to be formed, is provided with spacer,
n) forming a final conformal insulating layer of a final thickness on the whole device,
o) removing a final conformal insulating layer until the protective layer is exposed to form last spacers adjacent to the preceding spacers and on the side walls of the gate electrodes of the last portion of the device, wherein the spacers are to be formed.

The characteristics and the advantages of the process according to an embodiment the invention will be apparent from the following description of an embodiment thereof given by way of indicative and non-limiting example with reference to the annexed drawings.

BRIEF DESCRIPTION OF THE SEVERAL VIEWS OF THE DRAWINGS

A more complete understanding of the method and apparatus of the present invention may be acquired by reference to the following Detailed Description when taken in conjunction with the accompanying Drawings wherein:

FIGS. 1a1, 2a1, 3a1, 4a1, 5a1, 6a1, 7a1, 8a1, and 9a1 show vertical section views of a first portion of a memory electronic device, during some forming steps of a process according to a first embodiment of the invention, FIGS. 1a2, 2a2, 3a2, 4a2, 5a2, 6a2, 7a2, 8a2, and 9a2 show vertical section views of a second portion of a memory electronic device, during some forming steps of process according to the first embodiment of the invention, FIGS. 1a3, 2a3, 3a3, 4a3, 5a3, 6a3, 7a3, 8a3, and 9a3 show vertical section views of a third portion of a memory electronic device, during some forming steps of a process according to the first embodiment of the invention, FIGS. 10a1, 11a1, 12a1, 13a1, 14a1, 15a1, 16a1, and 17a1 show vertical section views of a first portion of a memory electronic device, during some forming steps of a process according to a second embodiment of the invention, FIGS. 10a2, 11a2, 12a2, 13a2, 14a2, 15a2, 16a2, and 17a2 show vertical section views of a second portion of a memory electronic device, during some forming steps of the process according to the second embodiment of the invention, FIGS. 10a3, 11a3, 12a3, 13a3, 14a3, 15a3, 16a3, and 17a3 show vertical section views of a third portion of a memory electronic device, during some forming steps of the process according to the second embodiment of the invention, FIGS. 18a1, 18a2 and 18a3 are images of portions of the final memory electronic device formed with the process according to an embodiment of the invention.

DETAILED DESCRIPTION OF THE INVENTION

With reference to these figures, a non-volatile memory electronic device 1 formed on a semiconductor substrate 2 is described.

The process steps and the structures described hereafter do not form a complete process flow for forming integrated circuits.

The figures which represent cross sections of portions of an integrated circuit during the formation are not drawn to scale, but are instead drawn so as to show process steps of some embodiments of the invention.

The process steps shown can be put into practice together with the forming techniques of the integrated circuits currently used in the field and only those commonly used process steps helpful for the comprehension of the present invention are included.

In particular, the process according to an embodiment of the invention will be described with reference to the formation of a memory electronic device 1 comprising a matrix of non-volatile memory cells with NOR architecture by mere way of example.

For example, a process will be described for forming three spacers of different width: first thin spacers for the memory cell, for example of about 50 nm of width, formed for example in the sole drain region, second spacers of great width for the HV transistors, for example of about 160 nm and third spacers of intermediate width for the LV transistors, for example of about 100 nm.

Nothing however forbids that the process according to an embodiment of the invention can be advantageously used for forming two sole spacers of different widths.

In particular, with reference to FIGS. 1a1 to 9a3, a memory electronic device 1 is shown formed on a substrate 2 which comprises three distinct portions:

a first portion, shown with reference to FIGS. 1a1, 2a1, . . . , 9a1, wherein high voltage HV transistors 4 are integrated, a second portion, shown with reference to FIGS. 1a2, 2a2, . . . , 9a2, wherein low voltage LV transistors 5 with high performance are integrated, and a third portion, shown with reference to FIGS. 1a3, 2a3, . . . , 9a3, wherein a matrix of memory cells 3 is integrated, wherein the memory cells are organized in rows, called word lines, and columns, called bit lines.

The process according to an embodiment of the invention provides, in a conventional way, the formation of wells of the P and N type and of active areas delimited by insulation structures in the semiconductor substrate 2.

On these active areas respective gate oxide layers 6a1, 6a2, 6a3, respective gate electrodes 7a1, 7a2, 7a3 and respective source/drain regions 8a1, 8a2, 8a31/8a32 self-aligned respectively to the gate electrodes 7a1, 7a2, 7a3 of the HV transistors 4, of the LV transistors 5 and of the memory cells 3 are formed as shown in FIGS. 1a1-1a3.

According to an embodiment of the invention, on the whole device 1 a protective layer 10 is formed. For example, a protective layer 10 is formed by a silicon nitride layer of thickness $L_N$ equal to about 15 nm, as shown in FIGS. 2a1-2a3.

Advantageously, before forming the protective layer 10 an insulating layer 9 is formed, for example of silicon oxide of thickness $L_R$ equal to about 15 nm that can be selectively etched with respect to the protective layer 10.

Advantageously, the formation of the insulating layer 9 and of the protective layer 10 is carried out through deposition.

On the whole memory electronic device 1 a second insulating layer 11 of the conformal type is formed that can be selectively etched with respect to the protective layer 10, for example of oxide of thickness equal to 60 nm, as shown in FIG. 3a1-3a3.

Advantageously, the thickness of this second insulating layer 11 is equal to the width $L_{HV}$ of final spacers which will be formed in the first portion a1 of the device 1, reduced by the width $L_{LV}$ of final spacers which will be formed in the second portion a2 of the device 1.

Advantageously, the formation of the second insulating layer 11 is carried out through deposition.

In the embodiments shown in the figures, the width A1 of the source region 8a31 of the memory cells 3 is smaller than the width A2 of the drain region 8a32 and of such thickness that the source region 8a31 of the cell 3 is completely filled in by the second insulating layer 11.

The process continues with the formation of a first mask 12 (non-critical, i.e., whose alignment to the underlying structures has good tolerances, and whose openings are dimensions greater then the obtainable photo-lithographic minimum) which shields the first portion of the memory electronic device 1 wherein the HV transistors 4 are integrated, as shown in FIGS. 4a1-4a3.

From the second and third portions of the memory electronic device 1 the second insulation layer 11 is then removed.

The removal step is for example carried out by an isotropic etching step selective with respect to the protective layer 10, as shown in FIGS. 4a2-4a3. In particular, due to the conformation of the source region 8a31 of the memory cell 3, the second insulating layer 11 is only partially removed from the source region 8a31.

Once the first mask 12 has been removed, a third conformal insulating layer 13 is then deposited, for example of thickness equal to about 50 nm, as shown in FIGS. 5a1-5a3.

Advantageously, the thickness of this third insulating layer 13 is equal to the width $L_{LV}$ of final spacers which will be formed in the second portion a2 of the device 1, reduced by the width $L_C$ of final spacers which will be formed in the third portion a3 of the device 1.

Advantageously, this third conformal insulating layer 13 is formed by the same material as that of the second insulating layer 11.

The process continues with the formation of a second mask 14 (non-critical) which shields the first and the second portions of the memory electronic device 1, as shown in FIGS. 6a1-6a3.

From the third portion of the memory electronic device 1 the third conformal insulating layer 13 is then removed.

In particular, due to the conformation of the source region 8a31 of the memory cell 3, the third insulating layer 13 is only partially removed from the source region 8a31.

Advantageously, this latter removal step is for example carried out by an isotropic etching step selective with respect to the protective layer 10.

Once the second mask 14 has been removed, a fourth conformal insulating layer 15 is then formed, for example of thickness equal to about 20 nm, as shown in FIGS. 7a1-7a3.

Advantageously, the thickness of this fourth insulating layer 15 is equal to the width Lc of final spacers which will be formed in the third portion a3 of the device 1, reduced by the thickness $L_N$ of the protective layer 10 and by the thickness $L_R$ of the first insulating layer 9 if present.

Advantageously, this fourth conformal insulating layer 15 is formed by the same material as the second and third conformal insulating layers 11, 13.

As shown in FIGS. 8a1-8a3, an etching step of the conformal insulating layers 11, 13 and 15 then follows until the protective layer 10 is exposed.

Advantageously, this latter etching step is of the anisotropic type.

In particular, this etching step is calibrated for removing the maximum thickness of the conformal insulating layers 11, 13 and 15 present on the semiconductor substrate 2, i.e., equal to about 130 nm in the first portion of the memory electronic device 1.

Advantageously, according to an embodiment of the invention this etching step, very selective with respect to the protective layer 10, since in the third portion of the memory electronic device 1 the fourth conformal insulating layer 15 is very thin, has for example a thickness equal to only 20 nm.

Advantageously, in the case in which layers 11, 13 and 15 of silicon oxide and a layer 10 of silicon nitride are used, the selectivity of this latter etching step should be greater than 7 to 1 for ensuring that the etching of the oxide layers 11, 13 and 15 does not break the nitride layer 10 in the third portion of the memory electronic device 1.

In the hypothesis in which the width of each single spacer is equal to the thickness of the insulating layers 11, 13 and 15, at the end of this etching the three desired spacers are formed; therefore, according to this embodiment of the invention, it is possible to choose the thickness of the three insulating layers 11, 13 and 15 for obtaining the spacers of the desired widths $L_{HV}$, $L_{LV}$ and $L_C$.

The process of definition of the spacers ends with the anisotropic etching of the uncovered protective layer 10, which has served as a layer for stopping the etching of the insulating layers 11, 13 and 15, as shown in FIGS. 9a1-9a3.

Advantageously, the insulating thin layer 9 immediately in contact with the gate electrodes 7a1, 7a2 and 7a3 and the semiconductor substrate 2 of the active areas is instead left as protection for the implants of the junctions n+ and p+. The process then continues in a conventional way, with the possibility of forming salicide layers on the gate electrodes and on the junctions.

With reference to FIGS. 10a1 to 17a3, a process according to a second embodiment of the invention is described.

The process steps described with reference to the FIGS. 1a1-3a3 are the same as those of the process according to this second embodiment the invention and for this reason they will not be described again.

Elements being structurally and functionally identical to the process steps described with reference to FIGS. 1a1-9a3 will be given the same reference numbers.

As shown in FIGS. 10a1-10a3, a removal step of the second insulating layer 11 is then carried out until the protective layer 10 is exposed to form the first spacers 11a.

Advantageously, this removal step is for example carried out by means of an anisotropic step. In particular, due to the conformation of the source region 8a31 of the memory cell 3, the second insulating layer 11 is only partially removed from the source region 8a31.

A first mask 12a (non-critical) is then formed on the first portion of the memory electronic device 1 wherein the HV transistors 4 are integrated.

From the second and third portions of the memory electronic device 1 the first spacers 11a are then removed, as shown in FIGS. 11a2-11a3.

Advantageously, the removal step is carried out by means of an isotropic etching step selective with respect to the protective layer 10. In particular, due to the conformation of the source region 8a31 of the memory cell 3, the second insulating layer 11 is only partially removed from the source region 8a31.

Once the first mask 12a has been removed, a third conformal insulating layer 13 is then formed, for example of thickness equal to about 50 nm, as shown in FIGS. 12a1-12a3.

Advantageously, the thickness of this third insulating layer 13 is equal to the width $L_{LV}$ of final spacers which will be formed in the second portion a2 of the device 1, reduced by the width $L_C$ of final spacers which will be formed in the third portion a3 of the device 1.

Advantageously, this third conformal insulating layer 13 is formed by the same material as the second conformal insulating layer 11.

As shown in FIGS. 13a1-13a3, a removal step of the third insulating layer 13 is then carried out until the protective layer 10 is exposed to form second spacers 13a.

In particular, in the first portion of the memory device 1 these second spacers 13a are placed side by side to the first spacers 11a to form spacers of width $L_{IN}$ equal to $L_{HV}$-$L_C$.

Advantageously, this removal step is for example carried out by means of an anisotropic etching step. In particular, due to the conformation of the source region 8a31 of the memory cell 3, the third insulating layer 13 is only partially removed from the source region 8a31.

The process continues with the formation of a second mask 14a (non-critical) which shields the first and the second portions of the memory electronic device 1.

From the third portion of the memory electronic device 1 the second spacers 13a are then removed, as shown in FIGS. 14a1-14a3.

In particular, due to the conformation of the source region 8a31 of the memory cell 3, the third insulating layer 13 is only partially removed from the source region 8a31.

The removal step is for example carried out by means of an an isotropic etching step selective with respect to the protective layer 10.

Once the mask 14a has been removed, a fourth conformal insulating layer 15 is then formed, for example with thickness equal to about 20 nm, as shown in FIGS. 15a1-15a3.

Advantageously, the thickness of this fourth insulating layer 15 is equal to the width $L_C$ of final spacers which will be formed in the third portion a3 of the device 1, reduced by the thickness of the protective layer 10 and by the first insulating layer 9 of present.

Advantageously, this fourth conformal insulating layer 15 is formed by the same material of the second and third conformal insulating layer 11, 13.

As shown in FIGS. 16a1-16a3, a removal step of the fourth insulating layer 13 is then carried out until the protective layer 10 is exposed to form third spacers 15a.

Advantageously, this removal step is for example carried out by means of an anisotropic etching step. In particular, due to the conformation of the source region 8a31 of the memory cell 3, the fourth insulating layer 15 is only partially removed from the source region 8a31.

In particular, in the first portion of the memory device 1 these third spacers 15a are placed side by side to the second spacers 13a to form spacers of width $L_{HV}$, in the second portion of the memory device 1 these third spacers 15a are placed side by side to the second spacers 13a to form spacers of width $L_{LV}$, while in the third portion spacers of width $L_C$ remain defined.

As shown in FIGS. 17a1-17a3, the definition process of the spacers ends with an etching step, for example anisotropic, of the protective layer 10 not covered by the spacers, which has served as layer to stop the etching of the spacers.

Although the process according to embodiments of the invention has been described with reference to the formation of three groups of spacers of different dimensions, it can be advantageously applied to N differential spacers of final growing width L1, L2 . . . , LN in N separated regions A1, A2 . . . , AN.

The process according to this further embodiment of the invention for forming a memory device 1 on a substrate 2 comprises the steps of:

forming the gate electrodes of the matrix of memory cells and of the associated circuitry, forming the source/drain regions of the cells and first "low doped drain" portions of the source/drain regions of the transistors of the circuitry.

according to this further embodiment of the invention, the process provides the steps of:

1. formation of a first conformal insulating thin layer 9, for example of silicon oxide, of a first thickness X1. This layer could also not be present, 2. formation of a protective conformal thin layer 10, for example of silicon nitride, of a second thickness X2, 3. formation of a second conformal insulating layer 11, for example of oxide, of a third thickness SN equal to LN−LN-1,
   3.1 formation of a first mask 12 which covers the regions AN wherein spacers of width SN are provided,
   3.2 removal, for example with wet etching, of the second insulating layer 11 not covered by the first mask 12; advantageously, the wet etching serves to ensure a very high selectivity on the protective layer,
   3.3 removal of the first mask 12,
4. formation of a third conformal insulating layer 13, for example of silicon oxide, of a fourth thickness SN-1 equal to LN-1−LN-2,
   4.1 formation of a second mask 14 which covers the regions AN and AN-1 wherein spacers of width SN and SN-1 are provided,
   4.2 removal, for example with wet etching, of the third insulating layer 13 not covered by the second mask 14; advantageously, the wet etching serves to ensure a very high selectivity on the protective layer 10,
   4.3 removal of the second mask 14,
5. . . . repetition of the operations of deposition, masking and removal of the insulating layers not covered by the masks until a sole region A1 of the device, wherein the thinner spacers are to be formed, is not coated by a insulating layer,
6. then forming a last insulating layer 15 of thickness S1=L1−X1−X2, if the layer 9 is present, in such a way as to obtain that the different regions A1, A2 . . . , AN are effectively covered by dielectric layers of overall thickness equal to L1, L2 . . . , LN,
7. single etching of the insulating layers for example of the anisotropic type on the whole memory device 1 for forming the spacers; the etching must be calibrated for etching the maximum thickness of the insulating layers overlapped onto each other LN−X1−X2, if the layer 9 is present, with such selectivity with respect to the protective layer 10 as to allow an overetch equal to at least the difference LN−L1 of thickness of the insulating layers being present,
8. etching of the protective layer 10, for example anisotropic, for removing the protective layer 10 not covered by the spacers (selective etching with respect to the underlying insulating layer 9).

At the end of these steps N different spacers of width L1, L2 . . . , LN are formed, in the hypothesis that the width of the spacer is, in each case, equal to the thickness of the insulating layers covering the different regions. In any case, the process can be carried out also in the case in which the width of the spacers is not equal to the thickness of the insulating layers to be etched. In this case each single formation of these layers will be calibrated so as to obtain, after the etching, the desired dimensions. All the spacers thus formed share a common structure: a thin oxide layer, if present, covered by a thin protective layer, for example of nitrate, and by a last insulating layer of variable dimension, for example of oxide. The cost of this process is equal to N-1 specific, non-critical masks.

Also the process according to the second embodiment of the invention can be used for obtaining a plurality of spacers of different growing widths equal to L1, L2 . . . , LN. In this embodiment, after the formation of the gate electrodes of the circuitry and of the first weakly doped portions of the transistors of the circuitry, the process provides the steps of:
1. formation of a first insulating conformal thin layer 9 for example of silicon oxide of a first thickness X1. However, this layer could also not be present,
2. formation of a protection conformal thin layer 10, for example of silicon nitride of a second thickness X2,
3. formation of a second conformal insulating layer 11 for example of oxide of third thickness SN=LN−LN-1
   3.1 etching of the second conformal insulating layer 11 until the protective layer 10 is uncovered for forming first spacers 11a of width SN on the side walls of the gate electrodes. Advantageously, the etching step is of the anisotropic type and is calibrated for removing the second conformal insulating layer 11 of thickness SN. In particular this etching step is selective with respect to the protective layer 10.
   3.2 forming a first mask 12a which covers the regions AN wherein spacer of width SN are present,
   3.3 removal of the first spacers 11a for example with wet etching for ensuring a very high selectivity of this etching step with respect to the protective layer 10,
   3.4 removal of the first mask 12a,
4. formation of a third insulating conformal layer 13, for example of oxide of a fourth thickness SN-1=LN-1−LN-2
   4.1 etching of the third insulating conformal layer 13 of thickness SN-1 for example of the anisotropic type, for forming further spacers of width SN-1+SN in the region AN and of width SN-1 on the whole remaining surface of the device 1. In particular, the etching step is selective with respect to the protective layer 10.
   4.2 formation of a second mask 14a which covers the regions AN and AN-1 wherein spacers of width SN-1+SN and SN-1 are provided,
   4.3 removal of the spacers of width SN-1, for example with wet etching for ensuring a very high selectivity of this etching step with respect to the protective layer 10,
   4.4 removal of the second mask 14a,
5. . . . repetition of the operations of deposition, anisotropic etching, masking and removal operations of the insulating layers until a sole region A1 of the device, wherein the spacers are to be formed, is provided with spacer,
6. deposition of the last conformal insulating layer 15 of thickness S1=L1−X1−X2, if the layer 9 is present, so as to obtain that the different regions A1, A2 . . . , AN effectively have differential spacers of dimensions equal to L1, L2 . . . , LN,
7. etching of the protective layer 10, for example anisotropic, for removing the protective layer 10 not covered by the spacers (selective etching with respect to the underlying insulating layer 9).

With this alternative sequence a plurality of spacers with different lengths is obtained, as in the process according to the first embodiment of the invention (with possible re-calibration of the thickness of the layers deposited with respect to the dimensions of the spacers, in the case in which the dimension of the spacer does not correspond to the thickness of the insulating layers to be etched) by substituting a succession of anisotropic etchings for the single final anisotropic etching, with the same cost in terms of masks.

The choice between the two schemes depends on the selectivity on the protective layer (for example nitride) the etching steps (isotropic and anisotropic) of the insulating layers (for example of oxide) succeed in ensuring and on the overall morphology of the spacers, which is function also of the height of the gate electrodes in circuitry and in matrix.

The process according to the embodiments of the invention can be applied to any electronic device and in particular can be especially advantageous if the electronic device comprises a matrix of memory cells of the EPROM and Flash EEPROM type with NOR or NAND organization, with single level and greater multilevel region, for which the formation of differential spacers can be an essential passage for integrating the memory cells with the different types of transistors present in the circuitry for handling the high voltages and in the possible high performance circuitry.

Therefore, although the process has been described with reference to the integration of high density floating gate memories with LV and HV transistors, its application can be extended to any process which provides the use of at least two groups of MOS transistors for which it is necessary a differentiation of the spacers.

In particular, according to an embodiment of the invention the spacers are formed especially by oxide layers and are thus particularly compatible with the demands for scalability of the memory matrixes also allowing to minimize the overall dielectric constant of the dielectric layers which separate the cells of the memory matrix, so as to reduce the capacitive couplings between the floating gate electrodes which are a source of disturbances during the reading step of the cell.

Although preferred embodiments of the process of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims

The invention claimed is:

1. A process, comprising:
forming a first portion of an electronic device integrated on a semiconductor substrate, wherein forming the first portion includes forming first transistors each comprising a gate electrode projecting from the semiconductor substrate and respective source/drain regions;
forming a second portion of the electronic device by steps including forming second transistors each comprising a gate electrode projecting from the semiconductor substrate and respective source/drain regions;
forming in cascade a first protective layer and a first conformal insulating layer of a first thickness on the first and second portions of the electronic device;
forming a first mask covering the first portion of the electronic device;
removing first portions of the first conformal insulating layer not covered by the first mask;
removing the first mask;
forming a second conformal insulating layer of a second thickness on the first and second portions of the electronic device after removing the first portions of the first conformal insulating layer; and
forming first spacers of a first width on side walls of the gate electrodes of the first portion of the electronic device and second spacers of a second width on side walls of the gate electrodes of the second portion of the electronic device by removing second portions of the first conformal insulating layer and first portions of the second conformal insulating layer until first portions of the protective layer are exposed, wherein removing the second portions of the first conformal insulating layer is performed after removing the first portions of the first conformal insulating layer and after forming the second conformal insulating layer on the first conformal insulating layer and on the second portion of the electronic device.

2. The process of claim 1 forming a further conformal insulating layer on the first and second portions of the electronic device before forming the first conformal insulating layer.

3. The process of claim 1, wherein the first and second spacers cover second portions of the protective layer, the process further comprising:
after forming the first and second spacers, etching the first portions of the protective layer while the first and second spacers cover the second portions of the protective layer.

4. The process of claim 1, further comprising:
forming a third portion of the electronic device by steps including forming third transistors each comprising a gate electrode projecting from the semiconductor substrate and respective source/drain regions, wherein the first and second conformal insulating layers are formed on the third portion of the electronic device;
forming a second mask covering the first and second portions of the electronic device without covering the third portion of the electronic device;
removing second portions of the second conformal insulating layer not covered by the second mask;
forming a third conformal insulating layer on the first, second, and third portions of the electronic device after removing the second portions of the second conformal insulating layer not covered by the second mask; and
forming third spacers of a third width on side walls of the gate electrodes of the third portion of the electronic device, wherein forming the first spacers includes removing portions of the third conformal insulating layer before removing the second portions of the first conformal insulating layer and the first portions of the second conformal insulating layer.

5. The process of claim 1, wherein the conformal insulating layers are formed by oxide layers and the protective layer is formed by a nitride layer.

6. The process of claim 1, wherein the first thickness of the first conformal insulating layer is equal to about 60 nm, the second thickness of the second conformal insulating layer is equal to about 20 nm, and the protective layer is of a thickness equal to about 15 nm.

7. The process of claim 1, wherein forming the first and second spacers includes anisotropically removing the second portions of the first conformal insulating layer and the portions of the second conformal insulating layer; and removing the first portions of the first conformal insulating layer includes isotropically removing the first portions of the first conformal insulating layer.

8. The process of claim 1, wherein the second transistors are floating gate transistors which form non-volatile memory cells.

9. The process of claim 1, wherein:
forming the first mask includes covering the second portions of the first conformal insulating layer on the first portion of the electronic device;
removing the first portions of the first conformal insulating layer includes exposing second portions of the first protective layer that are on the second portion of the electronic device;
forming the second conformal insulating layer includes forming the second conformal insulating layer on the second portions of the first conformal insulating layer and directly on the exposed second portions of the protective layer; and
removing the second portions of the first conformal insulating layer and first portions of the second conformal insulating layer includes removing the second portions of the first conformal insulating layer and first portions of the second conformal insulating layer until the first and second portions of the protective layer are exposed; and removing the second portions of the first conformal insulating layer includes removing the second portions of the first conformal insulating layer after forming the second conformal insulating layer on the second portions of the first conformal insulating layer and directly on the exposed second portions of the protective.

10. A process, comprising:
forming first and second portions of an electronic device integrated on a semiconductor substrate wherein forming the first and second portions includes forming respective transistors, each comprising a gate electrode projecting from the semiconductor substrate, and respective source/drain regions;
forming in cascade a protective layer and a first conformal insulating layer on the first and second portions of the electronic device;
forming a first mask covering the first portion of the electronic device;
removing first portions of the first conformal insulating layer not covered by the first mask while protecting second portions of the first conformal insulating layer with the first mask;
removing the first mask;
forming a second conformal insulating layer on the first and second portions of the electronic device, including on the second portions of the first conformal insulating layer;
forming first spacers on respective side walls of the gate electrodes of the first portion of the electronic device by anisotropically etching the second conformal insulating layer and anisotropically etching the second portions of the first conformal insulating layer after anisotropically etching the second conformal insulating layer.

11. The process of claim 10, further comprising forming a further conformal insulating layer on the first and second portions before forming the first conformal insulating layer.

12. The process of claim 11, wherein the first spacers cover first portions of the protective layer, the process further comprising:
after forming the first spacers, etching second portions of the protective layer while the first spacers cover the first portions of the protective layer.

13. The process of claim 10, wherein the conformal insulating layers are formed by oxide layers and the protective layer is formed by a nitride layer.

14. The process of claim 10, further comprising:
forming a third portion of the electronic device by steps including forming third transistors each comprising a gate electrode projecting from the semiconductor substrate and respective source/drain regions, wherein the first and second conformal insulating layers are formed on the third portion of the electronic device;
forming a second mask covering the first and second portions of the electronic device without covering the third portion of the electronic device;
removing first portions of the second conformal insulating layer not covered by the second mask while protecting second portions of the second conformal insulating layer with the second mask; and
forming a third conformal insulating layer on the first, second, and third portions of the electronic device after removing the first portions of the second conformal insulating layer not covered by the second mask, wherein forming the first spacers includes anisotropically etching the third conformal insulating layer before anisotropically etching the second portions of the first conformal insulating layer and the second conformal insulating layer.

15. The process of claim 14, wherein:
anisotropically etching the second and third conformal insulating layers also forms second spacers on sidewalls of the gate electrodes of the second portion of the electronic device; and
anisotropically etching the third conformal insulating layer also forms third spacers on sidewalls of the gate electrodes of the third portion of the electronic device.

16. The process of claim 10, wherein the transistors of a third portion of the plurality are floating gate transistors forming non-volatile memory cells.

17. The process of claim 10, wherein anisotropically etching the second conformal insulating layer also forms second spacers on sidewalls of the gate electrodes of the second portion of the electronic device.

18. The process of claim 10, wherein anisotropically etching the second conformal insulating layer also forms second spacers on sidewalls of the gate electrode of the second portion of the electronic device.

19. A process, comprising:
forming first and second portions of an electronic device integrated on a semiconductor substrate wherein forming the first and second portions includes forming respective transistors, each comprising a gate electrode projecting from the semiconductor substrate, and respective source/drain regions;
forming in cascade a protective layer and a first conformal insulating layer on the first and second portions of the electronic device, the protective layer including a first portion on the first portion of the electronic device and a second portion on the second portion of the electronic device;
forming a first mask covering first portions of the first conforming insulating layer on the first portion of the electronic device;
exposing the second portion of the protective layer by removing second portions of the first conformal insulating layer not covered by the first mask while protecting the first portions of the first conformal insulating layer with the first mask, the removing including isotropically etching the second portions of the first conformal insulating layer;
removing the first mask;
forming a second conformal insulating layer on the first portions of the first conformal insulating layer and on the exposed second portion of the protective layer;
forming first spacers on respective side walls of the gate electrode of the first portion of the electronic device by anisotropically etching the second conformal insulating layer and anisotropically etching the first portions of the first conformal insulating layer after anisotropically etching the second conformal insulating layer.

20. The process of claim 19, further comprising:
forming a third portion of the electronic device by steps including forming a third transistor comprising a gate electrode, projecting from the semiconductor substrate, and source/drain regions, wherein the first and second conformal insulating layers are formed on the third portion of the electronic device;
forming a second mask covering the first and second portions of the electronic device without covering the third portion of the electronic device;

removing first portions of the second conformal insulating layer not covered by the second mask while protecting second portions of the second conformal insulating layer with the second mask; and forming a third conformal insulating layer on the first, second, and third portions of the electronic device after removing the first portions of the second conformal insulating layer not covered by the second mask, wherein forming the first spacers includes anisotropically etching the third conformal insulating layer before anisotropically etching the second portions of the first conformal insulating layer and the second conformal insulating layer.

21. The process of claim 20, wherein:

anisotropically etching the second and third conformal insulating layers also forms second spacers on sidewalls of the gate electrode of the second portion of the electronic device; and anisotropically etching the third conformal insulating layer also forms third spacers on sidewalls of the gate electrode of the third portion of the electronic device.

* * * * *